(12) United States Patent
Petchenev et al.

(10) Patent No.: US 7,693,212 B2
(45) Date of Patent: Apr. 6, 2010

(54) METHODS AND APPARATUS FOR FREQUENCY RECTIFICATION

(75) Inventors: Alexei Petchenev, Minden, NV (US); Olga Malakhova, Carson City, NV (US); John Wesley Grant, Garnerville, NV (US); Nathan Bowman Littrell, Gardnerville, NV (US); Charles Terrance Hatch, Gardnerville, NV (US)

(73) Assignee: General Electric Company, Schenectady, NY (US)

( * ) Notice: Subject to any disclaimer, the term of this patent is extended or adjusted under 35 U.S.C. 154(b) by 874 days.

(21) Appl. No.: 11/247,810

(22) Filed: Oct. 10, 2005

(65) Prior Publication Data
US 2007/0081583 A1 Apr. 12, 2007

(51) Int. Cl.
*H04B 1/38* (2006.01)
(52) U.S. Cl. .................................. 375/219; 455/192.2
(58) Field of Classification Search ................. 375/219; 455/192.2
See application file for complete search history.

(56) References Cited

U.S. PATENT DOCUMENTS

| | | | |
|---|---|---|---|
| 4,760,603 A | 7/1988 | Tsuda et al. | |
| 5,123,048 A | 6/1992 | Miyamae et al. | |
| 5,612,978 A * | 3/1997 | Blanchard et al. | ............ 375/350 |
| 6,131,013 A | 10/2000 | Bergstrom et al. | |
| 6,133,798 A | 10/2000 | Nagano et al. | |
| 6,484,132 B1 * | 11/2002 | Hively et al. | ................. 702/190 |
| 6,822,522 B1 | 11/2004 | Brown et al. | |
| 2003/0036071 A1 * | 2/2003 | Lukashin | ......................... 435/6 |
| 2003/0087617 A1 * | 5/2003 | Shohara | .................... 455/192.2 |

* cited by examiner

*Primary Examiner*—David C Payne
*Assistant Examiner*—Tanmay K Shah
(74) *Attorney, Agent, or Firm*—Armstrong Teasdale LLP

(57) ABSTRACT

A method of monitoring the condition of a machine is provided. The method includes receiving an input complex signal from the machine wherein the input complex signal has a plurality of signal components. The plurality of signal components includes at least one signal component containing a pre-determined frequency of interest and at least one signal component containing noise. The method further includes processing the input complex signal and generating an output complex signal having a plurality of signal components The plurality of signal components includes at least one signal component containing a pre-determined frequency of interest and at least one signal component containing noise. Processing the input complex signal includes executing a fixed-step integration and processing the output complex signal to assess whether a fault exists.

15 Claims, 19 Drawing Sheets

METHODS AND APPARATUS FOR FREQUENCY RECTIFICATION

BACKGROUND OF THE INVENTION

This invention relates generally to systems and methods for distinguishing a signal having a frequency of interest from noise and more particularly, to systems and methods for recovering a signal of interest from a complex signal.

Electric machines, such as motors, are used for a wide variety of applications including but not limited to closing or opening electric switches, and/or providing power to electrical appliances. A condition monitoring system may be used to evaluate the condition of an electric machine by monitoring pre-determined frequencies of interest associated with the machine. Monitoring the frequencies of interest with which such an electric machine operates facilitates accurately determining whether the machine is operating satisfactorily or malfunctioning.

At least some known condition monitoring systems sample a plurality of signals from the machines being monitored to determine the associated operating conditions and communicate these conditions to an operator. The signals collected may be complex signals composed of a plurality of components that includes a signal component containing a particular frequency of interest and a component containing noise. However, because the magnitude of the noise that may exist in a machine output signal, it may be difficult to isolate the component containing the frequency of interest. Moreover, in some instances, the component containing the frequency of interest may not be easily isolated from the noise component when such frequency of interest component is indistinguishable from the noise component.

To facilitate isolating the complex signal component containing the frequency of interest, at least some monitors use a filter to narrow a range of frequencies, from the sampled signals to a band of frequencies that includes the frequency of interest. After the operational frequency range is narrowed, the frequency of interest may then be detected from within the frequency band. However, when the complex signal component containing the frequency of interest is indistinguishable from the noise component, all spectrum peaks may represent frequencies of the noise rather than the frequency of interest. Arbitrarily selecting one of the spectrum peaks may produce random results with little assurance of isolating the frequency of interest. Thus, it may be difficult to distinguish the frequency of interest from within the frequency band.

To further facilitate isolating the signal component containing the frequency of interest of a machine, at least some monitors use at least one oscillator. The oscillator may be configured to facilitate improving a signal-to-noise ratio of an input complex signal by adjusting an oscillation frequency of the oscillator based on a pre-determined frequency of interest of the input complex signal. This process is sometimes referred to as frequency rectification.

At least some known oscillators include physical, analog devices that oscillate within a set of pre-defined parameters. For example, an oscillator may be configured to output a signal with a pre-defined amplitude or range of amplitudes at a pre-determined frequency or range of frequencies. More specifically, an oscillator may be configured to output a continuous signal with an amplitude that oscillates back and forth between two values for a pre-determined number of cycles in a pre-determined period of time. Alternatively, at least some known oscillators are configured as electronic computer simulations of physical, analog devices to generate output signals substantially similar to the physical, analog models they are based upon.

These oscillators may be configured such that they tend to oscillate in an undisturbed state with a substantially stable frequency until a perturbation is introduced. These oscillators may also be configured such that when a perturbation is introduced to the previously undisturbed oscillator, the oscillator may tend to migrate to an alternate, substantially stable state with characteristics that are similar to the characteristics of the perturbation. For example, such an oscillator may be configured such that it oscillates with an undisturbed oscillation frequency within an order of magnitude of a frequency of interest. When a complex input signal, with a frequency of interest and noise components as described above, is input to the oscillator, under certain conditions, the oscillator may shift its oscillation frequency to be substantially similar to that of the frequency of interest. The resultant output signal from the oscillator may be represented by a frequency spectrum that has a notable peak substantially close to the frequency of interest due to a reduction of the noise component amplitudes. The relative amplitude of the signal at the frequency of interest is therefore increased relative to the noise.

Upon completion of frequency rectification, frequency extraction may be used to generate a frequency of interest signal for further utilization in subsequent equipment condition monitoring.

When electronic computerized models of the aforementioned oscillators are configured to execute frequency rectification, the associated configurations use a set of algorithms that may consume a significant amount of computing resources and may provide an undesired delay in determining if equipment malfunctions exist.

BRIEF DESCRIPTION OF THE INVENTION

In one aspect, a method of monitoring the condition of a machine is provided. The method includes receiving an input complex signal from the machine wherein the input complex signal has a plurality of signal components. The plurality of signal components includes at least one signal component containing a pre-determined frequency of interest and at least one signal component containing noise. The method further includes processing the input complex signal and generating an output complex signal having a plurality of signal components. The plurality of signal components includes at least one signal component containing a pre-determined frequency of interest and at least one signal component containing noise. Processing the input complex signal includes executing a fixed-step integration and processing the output complex signal to assess whether a fault exists.

In another aspect, a monitoring system is provided. The monitoring system includes an analog-to-digital converter for converting an analog, sinusoidal signal received from a machine to a digital input complex signal, wherein the input complex signal has a plurality of signal components. The plurality of signal components include at least one signal component containing a pre-determined frequency of interest and at least one signal component containing noise. The system further includes a frequency rectifier with a plurality of accelerated integration algorithms for processing the input complex signal and generating an output complex signal. The output complex signal has a plurality of signal components. The plurality of signal components includes at least one signal component containing the pre-determined frequency of interest and at least one signal component containing noise. The system also includes at least one frequency extraction device having at least one time domain-to-frequency domain converter and a monitoring and diagnostic sub-system for processing the output complex signal from the frequency rectifier to assess whether a fault exists.

In a further aspect, a frequency rectification system is provided. The frequency rectification system includes an analog-to-digital converter for converting an analog, sinusoidal signal received from a machine to a digital input complex signal, wherein the input complex signal has a plurality of signal components. The plurality of signal components include at least one signal component containing a pre-determined frequency of interest and at least one signal component containing noise. The system also includes a frequency rectifier with a plurality of accelerated integration algorithms for processing the input complex signal and generating an output complex signal. The output complex signal has a plurality of signal components. The plurality of signal components includes at least one signal component containing the pre-determined frequency of interest and at least one signal component containing noise.

DETAILED DESCRIPTION OF THE INVENTION

Figure 1:
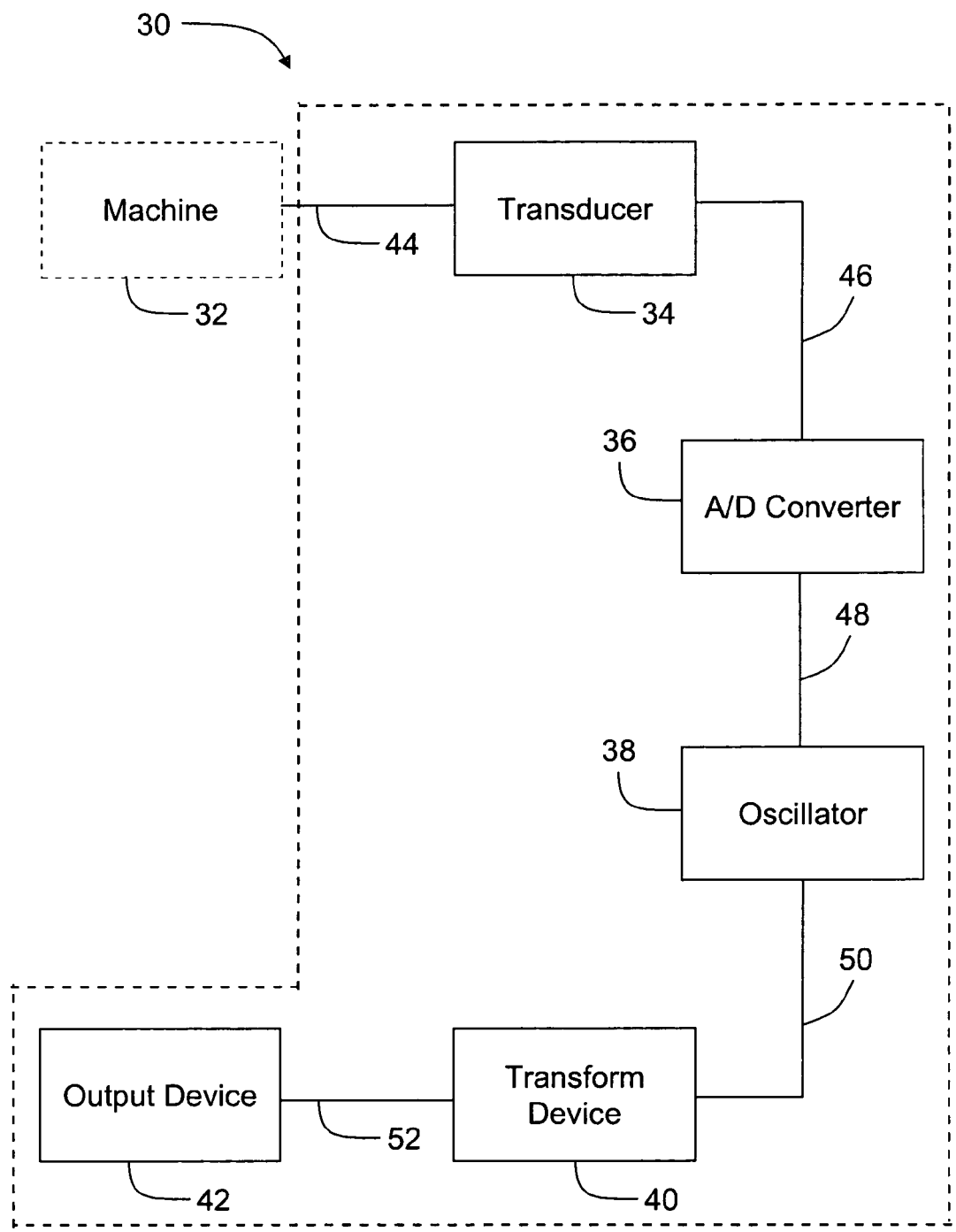
FIG. 1 is a block diagram of an exemplary embodiment of a system that may be used to distinguish a signal of interest from a complex signal.

FIG. 1 is an exemplary embodiment of a system 30 that may be used to distinguish a signal of interest from a complex signal. System 30 includes a transducer 34, an analog-to-digital (A/D) converter 36, an oscillator 38, a transform device 40, and an output device 42. In an alternative embodiment, oscillator 38 includes transform device 40 and output device 42. Transducer 34 may be coupled to a machine 32 to be monitored such as, but not limited to, a rotor shaft of an electric motor and/or a casing of a turbine. In the example embodiment, transducer 34 is an electromagnetic sensor that senses a change in electromagnetic signals. Such signal changes are generated by an oscillation, such as a rotation, of machine 32. Transducer 32 can, of course, be another type of sensor such as a vibration probe.

Oscillator 38, in the example embodiment, is a Van der Pol oscillator. Alternatively, oscillator 38 may be a general oscillator. Transform device 40 is a Fourier transform device that converts a signal from a time domain to a frequency domain. For example, in one embodiment, the Fourier transform device is a Fast Fourier transform device. Output device 42 may include a display, such as a cathode ray tube.

In operation, and with the example embodiment, transducer 34 generates a field, such as an electromagnetic field, around machine 32. Machine 32 oscillates within the electric magnetic field and such oscillation results in generation of a machine output signal 44. Transducer 34 senses machine output signal 44 and based on signal 44, generates an analog signal 36 that has a form suitable for reception by A/D converter 36. A/D converter 36 receives analog signal 46 and converts signal 46 from an analog form to a digital form.

In general, oscillators suitable for use in system 30, such as oscillator 38, may have operational characteristics governed by a second-order differential equation similar to:

$$d^2x(t)/dt^2 - z*(1-x(t)^2)*(dx(t)/dt) + w^2*x(t) = g*\cos(w_D*t) \quad (1)$$

wherein '*' represents multiplication, x represents any variable, for example, displacement, t represents time, d/dt represents a derivative with respect to time, (t) represents a variable as a function of time, (dx(t)/dt) represents a derivative of displacement with respect to time, i.e., velocity, $d^2x$ (t)/dt² represents a derivative of velocity with respect to time, i.e., acceleration, z represents a damping constant, $-z*(1-x(t)^2)*(dx(t)/dt)$ represents the damping term, w represents an undisturbed frequency, $g*\cos(w_D*t)$ represents a periodic driving (or, forcing) function, g represents a constant, $w_D$ represents a driving frequency, and $\cos(w_D*t)$ represents a trigonometric function. Alternatively, $\sin(w_D*t)$ may be used. The solution of equation (1) for x and its derivatives vary with respect to time and generate a non-linear, dynamical, oscillating output.

When the driving function is not present, equation (1) takes the form:

$$d^2x(t)/dt^2 - z*(1-x(t)^2)*(dx(t)/dt) + w^2*x(t) = 0 \quad (2)$$

When damping constant z is set to 0, equation (2) takes the form:

$$d^2x(t)/dt^2 + w^2*x(t) = 0 \quad (3)$$

which is a form of the general equation for simple harmonic motion and may represent a simple algorithm of oscillator 38.

As explained above, A/D converter 36 outputs an oscillator input complex signal 48 that includes a plurality of digitized signal 46 samples generated with a pre-determined sampling rate, in a pre-determined time period, wherein the time period may be referred to as a sampling time step. Signal 48 also includes a component that contains a frequency of interest and a noise component. The frequency of interest component of input complex signal 48 may be indistinguishable from the noise component of input complex signal 48. An example of a frequency of interest is a natural frequency of oscillation of machine 32. The natural frequency may be displayed on a label on machine 32. The natural frequency of machine 32 and the natural frequency of oscillator 38 may or may not be equal.

Prior to the introduction of signal 48 to oscillator 38, oscillator 38 may be oscillating at a pre-determined natural frequency as described above. When signal 48, containing the frequency of interest component and the noise component, is introduced to oscillator 38, oscillator 38 oscillation frequency may shift to the frequency of interest, i.e., oscillator 38 frequency may synchronize with the frequency of interest component of signal 48 and the noise component of signal 48 may be processed as described above. Oscillator output complex signal 50 includes a signal component containing the frequency of interest that attains apparent increased amplitude with respect to the associated noise component of signal 50 that has been minimized. Therefore, signal 50 may have a higher signal-to-noise ratio with respect to signal 48, and as such, the frequency of interest component of output 50 is distinguishable from the noise component.

Transform device 40 receives output complex signal 50 and transforms signal 50 from the time domain to the frequency domain to facilitate subsequent extraction of the frequency of interest from signal 50. In one embodiment, transform device 40 applies a Fourier transform or, alternatively, a Fast Fourier transform. Transform device 40 outputs a frequency domain signal 52 to output device 42 which displays frequency domain signal 52.

An operator views output device 42 and determines whether machine 32 is operating properly, such as by assessing whether the measured frequency is within a pre-determined frequency range or alternatively, within a variance of a pre-determined frequency. When machine 32 is not operating properly, the operator takes measures, such as calls a repair center, to improve the operation of machine 32. For example, machine 32 may be determined to be not operating properly when machine 32 oscillates with a frequency that is outside the pre-determined frequency range or alternatively, is outside the variance.

Figure 2:
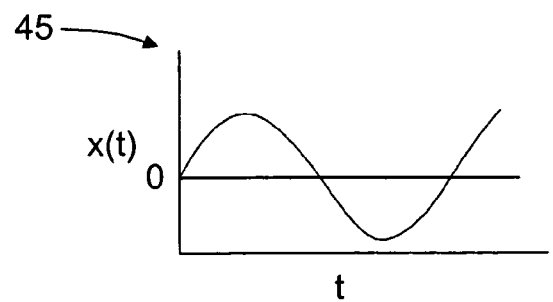
FIG. 2 is a graphical representation of an exemplary displacement versus time behavior of an exemplary simple harmonic oscillator that may be used with the system in FIG. 1.

FIG. 2 is a graphical representation of an exemplary displacement versus time behavior of exemplary simple harmonic oscillator 38 that may be used with system 30 (shown in FIG. 1). A simple harmonic oscillator time domain graph 45 is a graphical representation of the general behavior of a simple harmonic embodiment of oscillator 38 as represented in equation (3). Graph 45 includes displacement x(t) plotted on the abscissa (x-axis), time t plotted on the ordinate (y-axis), and a repeating sinusoidal curve with an amplitude of x(t) and a frequency of w.

Figure 3:
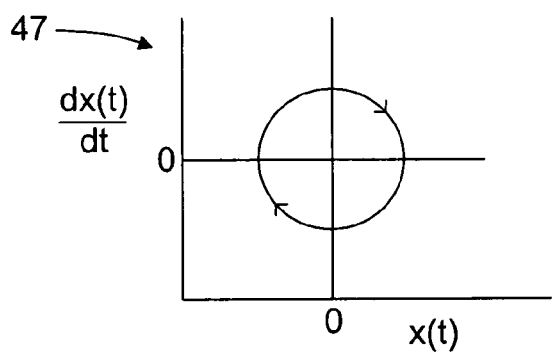
FIG. 3 is a graphical representation of an exemplary phase portrait of the exemplary simple harmonic oscillator that may be used with the system in FIG. 1.

FIG. 3 is a graphical representation of an exemplary phase portrait of exemplary simple harmonic oscillator 38 that may be used with system 30 (shown in FIG. 1). A simple harmonic oscillator phase portrait (sometimes referred to as a phase diagram or phase plane) graph 47 includes displacement x(t) plotted on the abscissa and velocity dx(t)/dt plotted on the ordinate. The behavior of the general solution to equation (3) is represented by a repeating circular pattern with the arrows illustrating the direction of oscillation with respect to time t. Solutions to equations similar to equations (1), (2), and (3) above are typically performed by computers using numerical integration techniques as described below.

Referring to equation (2) above, damping term $-z*(1-x(t)^2)*(dx(t)/dt)$ may determine the operational characteristics of oscillator 38. For example, when the value of x(t) is such that $(1-x(t)^2)$ is less than 0, damping term $-z*(1-x(t)^2)*(dx(t)/dt)$ is positive and the solution of equation (2) for x(t) is driven toward 0. In this way, large oscillations in amplitude are damped. Alternatively, when the value of x(t) is such that $(1-x(t)^2)$ is greater than 0, damping term $-z*(1-x(t)^2)*(dx(t)/dt)$ is negative and the solution of equation (2) for x(t) is driven away from 0. In this way, small oscillations in amplitude are magnified.

Figure 4:
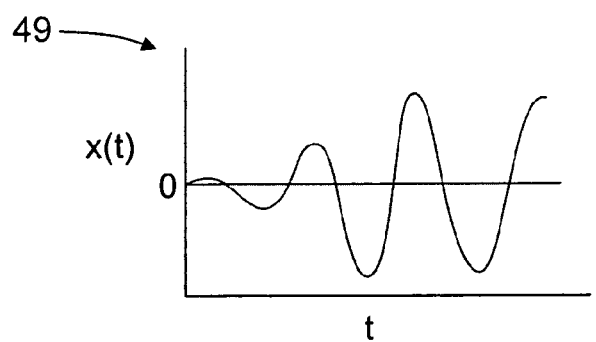
FIG. 4 is a graphical representation of an exemplary displacement versus time behavior of an exemplary oscillator that may be used with the system in FIG. 1.

FIG. 4 is a graphical representation of an exemplary displacement versus time behavior of exemplary oscillator 38 that may be used with 30 system (shown in FIG. 1). A damped harmonic oscillator time domain graph 49 is a graphical representation of the general behavior of a damped harmonic embodiment of oscillator 38 as represented in equation (2). When oscillator 38 oscillation is initiated at time t=0, x(t) may vary through a series of successively increasing amplitudes and over a period of time oscillator 38 may approach a substantially stable sinusoidal behavior.

Figure 5:
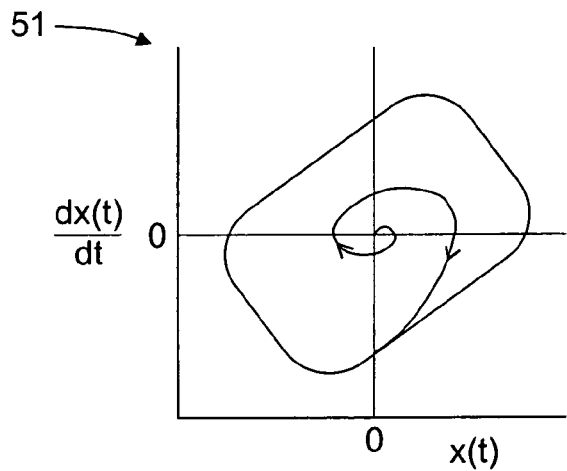
FIG. 5 is a graphical representation of an exemplary phase portrait of the exemplary oscillator that may be used with the system in FIG. 1.

FIG. 5 is a graphical representation of an exemplary phase portrait of exemplary oscillator 38 that may be used with system 30 (shown in FIG. 1). A damped harmonic oscillator phase portrait graph 51 illustrates a phase portrait that includes displacement x(t) plotted on the abscissa and velocity dx(t)/dt plotted on the ordinate. The initial behavior of the general solution to equation (2) is represented by an initial trajectory with the direction of oscillation with respect to time t illustrated by arrows. Subsequently, the behavior of oscillator 38 asymptotically approaches a closed trajectory that may be referred to as a limit cycle, i.e., oscillator 38 may oscillate with a substantially stable frequency w. This condition may be generally defined as an undisturbed oscillator condition.

In the undisturbed condition, oscillator 38 may have a bias to oscillate regardless of the value of input signal 48. For example, in the absence of signal 48, oscillator 38 develops equilibrium and may induce a substantially stable, internal oscillatory signal with an oscillation frequency and amplitude that is biased by selection of pre-determined parameters by an operator. The substantially stable, internal oscillation frequency is often referred to as the natural frequency of the oscillator. In this condition, the output 50 from oscillator 38 may include an amplitude and frequency that is substantially similar to those generated by the oscillation of oscillator 38. The natural frequency of oscillator 38 may be biased substantially equal to, i.e., within an order of magnitude of, a particular frequency of interest that may be determined from empirical operating evaluations or a knowledge base. Biasing of oscillator 38 via operator adjustment of oscillator 38 parameters is accomplished through a computer as discussed below.

Figure 6:
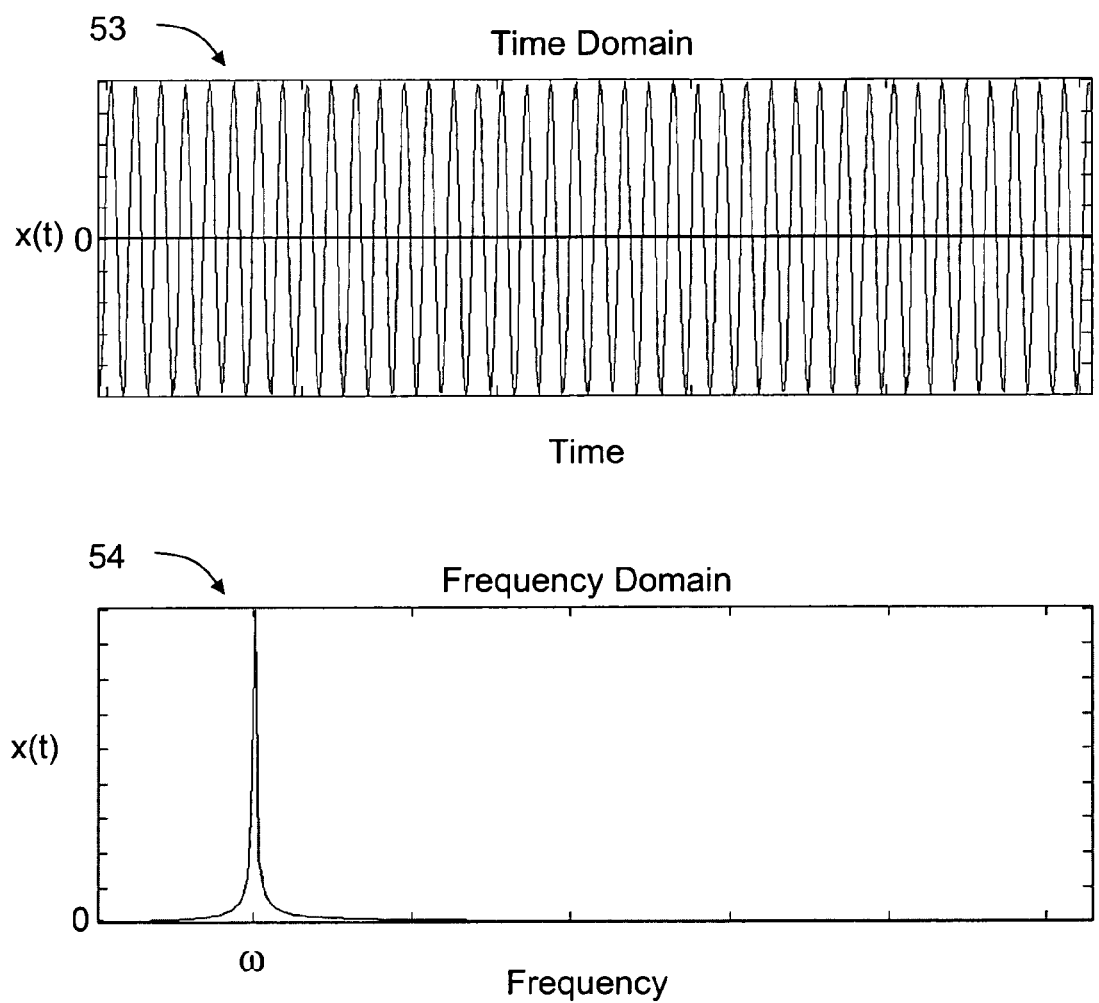
FIG. 6 is a graphical representation of an exemplary output of the oscillator that may be used with the system in FIG. 1.

FIG. 6 is a graphical representation of exemplary output 50 of oscillator 38. Graph 53 illustrates output 50 for oscillator 38 in a biased, undisturbed condition. Graph 53 includes displacement x(t) plotted on the abscissa, time t plotted on the ordinate, and a repeating sinusoidal curve with an amplitude of x(t) and a frequency of w. Biased, undisturbed oscillator frequency domain graph 54 illustrates a frequency spectrum of output 52 for biased, undisturbed oscillator 38. Graph 54 includes displacement x(t) plotted on the abscissa, frequency plotted on the ordinate, and a spectrum peak with an amplitude of x(t) at frequency w.

Referring to equation (1) above, the solution for x(t) and the behavior of oscillator 38 may be altered when driving function $g*\cos(w_D*t)$ is introduced. For this example, w and $w_D$ are not equal. However, they may be considered to be within an order of magnitude of each other. Introduction of the driving function introduces a perturbation into oscillator 38 that shifts the frequency of oscillator 38 to $w_D$ from w over a period of time. Oscillator 38 eventually attains an altered, substantially stable, oscillating frequency of $w_D$. This condition may be referred to as frequency locking, or frequency synchronization, and oscillator 38 attains an altered equilibrium. Frequency synchronization is facilitated when the amplitude of the driving function is sufficiently large, the amplitudes of the undisturbed oscillator condition and the driving function are substantially constant, the difference between w and $w_D$ is small, and w and $w_D$ are substantially constant.

Initial transmission of oscillator input complex signal 48, similar to the driving function described above, into oscillator 38 disturbs the equilibrium of oscillator 38. However, after a period of time, oscillator 38 may attain an altered biased condition with an altered equilibrium. While in the altered condition, oscillator output complex signal 50 is also altered and may attain a frequency value substantially similar to the frequency of interest component of input 48 that may be slightly different from the natural frequency of oscillator 38. When this condition is attained, oscillator 38 oscillations are synchronized with input 48. A graphical representation of output 50 when this condition exists may be substantially similar to graph 53 in FIG. 6 described above.

If an additional random noise component, for example, white noise, is introduced, in conjunction with the driving function, the solution of the equation may be altered. The following equation represents this condition:

$$d^2x(t)/dt^2 - z*(1-x(t)^2)*(dx(t)/dt) + w^2*x(t) = g*\cos(w_D*t) + \text{Noise}(t) \quad (4)$$

wherein Noise(t) represents the random noise component that may vary with time. The random noise component includes a plurality of random noise signals of varying frequencies and amplitudes within a frequency spectrum.

Figure 7:
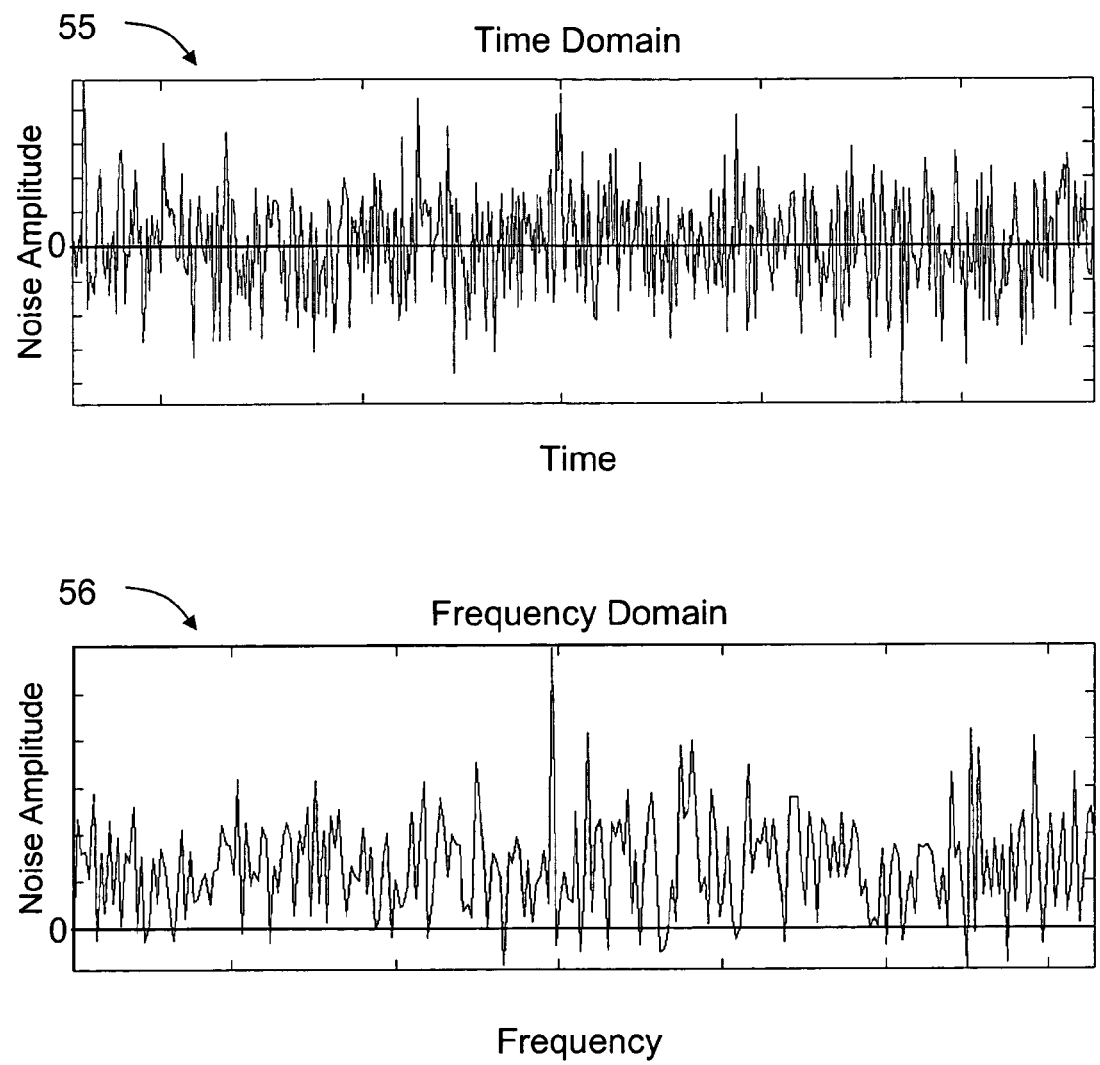
FIG. 7 is a graphical representation of an exemplary noise component of an input signal to the oscillator that may be used with the system in FIG. 1.

FIG. 7 is a graphical representation of an exemplary noise component of input signal 48 to oscillator 38. On a noise component time domain graph 55, the random noise component may typically be represented by a rapidly shifting amplitude (on the ordinate) versus time (on the abscissa). On a noise component frequency domain graph 56, the noise component may be represented by a frequency spectrum (on the abscissa) with constantly rapidly shifting amplitudes (on the ordinate) for a plurality of frequencies across the spectrum. The amplitude of frequencies in a frequency range that includes w and $w_D$ may be greater in the noise component than in the driving function component of equation (1), thereby "burying" a frequency of interest under noise. An integration time step large enough to preclude integrating a significant fraction of the random noise signals may be predetermined. The plurality of integrations over time of the noise component, that includes rapid and random shifting of amplitudes across the frequency spectrum, minimizes the effects of the noise component on the solution. The damping term further minimizes the effects of noise on the solution via the behavior described above. Therefore, the solution to equation (4) that contains the noise component is substantially similar to the solution to equation (1) that does not contain a noise component. Subsequently, oscillator 38 may oscillate at a frequency of $w_D$.

Figure 8:
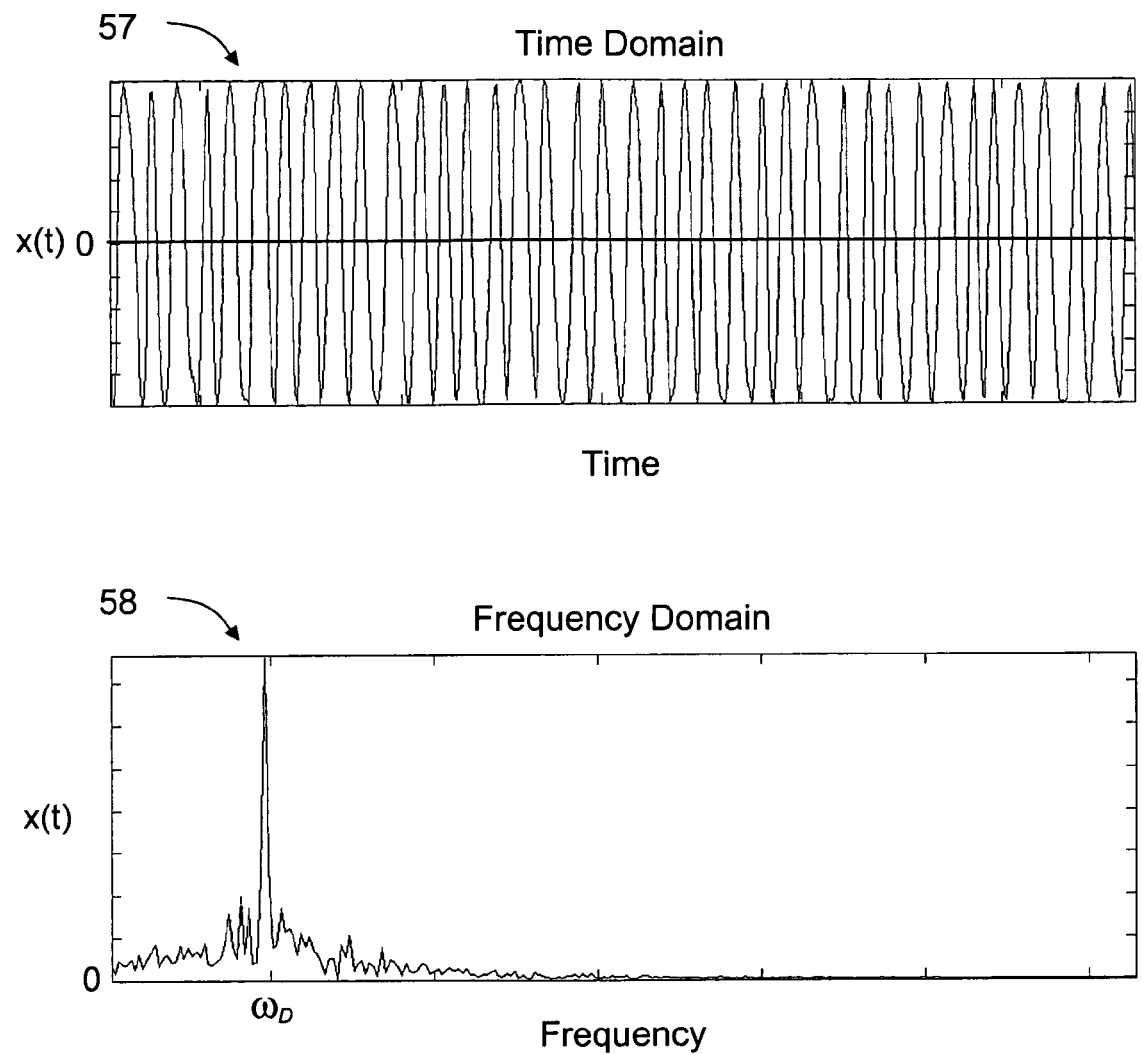
FIG. 8 is a graphical representation of an exemplary output of the oscillator that may be used with the system in FIG. 1.

FIG. 8 is a graphical representation of an exemplary output of oscillator 48. A distinguishable frequency of interest in oscillator output time domain graph 57 represents the output of oscillator 38 in the time domain subsequent to the introduction of the noise component in signal 48. Graph 57 includes displacement x(t) plotted on the abscissa, time t plotted on the ordinate, and a repeating sinusoidal curve with an amplitude of x(t) and a frequency of $w_D$. A distinguishable frequency of interest in oscillator output frequency domain graph 58 represents signal 52 in the frequency domain subsequent to the introduction of the noise component in signal 48. Graph 58 includes displacement x(t) plotted on the abscissa, frequency plotted on the ordinate, and a spectrum peak with an amplitude of x(t) at frequency $w_D$.

Transform device 40 (shown in FIG. 1) receives output complex signal 50 (shown in FIG. 1) and transforms signal 50 from the time domain to the frequency domain to facilitate subsequent extraction of the frequency of interest from signal 50. In one embodiment, transform device 40 applies a Fourier transform or, alternatively, a Fast Fourier transform. Transform device 40 outputs a frequency domain signal 52 (shown in FIG. 1) to output device 42 (shown in FIG. 1) which displays frequency domain signal 52. A graphical representation of oscillator 38 (shown in FIG. 1) synchronized to input signal 48 (shown in FIG. 1) is substantially similar to graph 54 (shown in FIG. 6) with the exception that the frequency peak occurs at frequency equals $w_D$.

Figure 9:
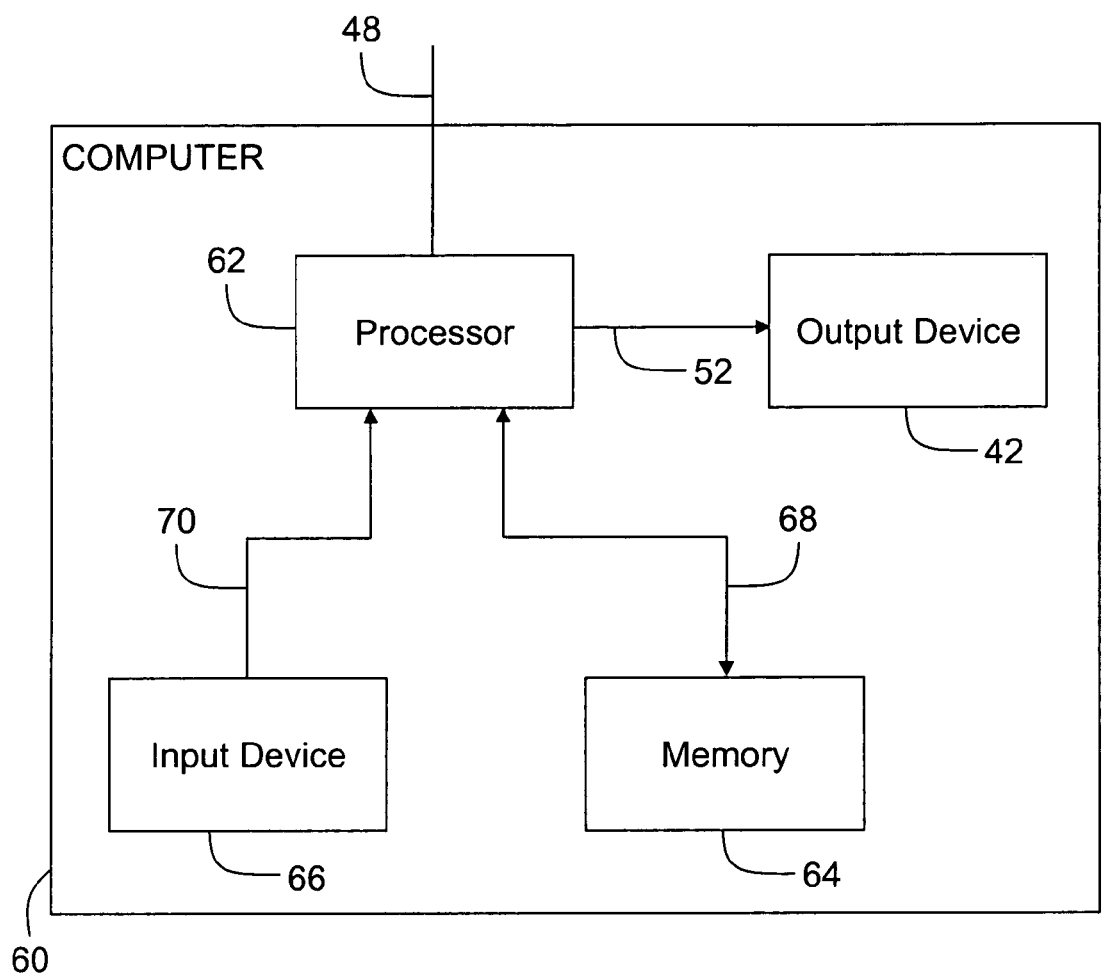
FIG. 9 is a block diagram of an exemplary embodiment of a computer that may be used with the system in FIG. 1.

FIG. 9 is a block diagram of an exemplary embodiment of a computer 60 that may be used with system 30 (shown in FIG. 1), which is an example of oscillator 38 and transform device 40. Computer 60 includes a processor 62, a memory 64, an input device 66, and output device 42. As used herein, the term computer is not limited to just those integrated circuits referred to in the art as a computer, but broadly refers to a processor, a microcontroller, a microcomputer, a programmable logic controller, an application specific integrated circuit, and other programmable circuits, and these terms are used interchangeably herein. In the exemplary embodiment, memory 64 may include, but is not limited to, a computer-readable medium, such as a random access memory. Alternatively, a floppy disk, a compact disc-read only memory (CD-ROM), a magneto-optical disk (MOD), and/or a digital versatile disc (DVD) may also be used. Also, in the exemplary embodiment, input device 66 may represent, but is not limited to, computer peripherals such as a mouse and a keyboard. Alternatively, other computer peripherals may also be used, for example, a scanner.

Processor 62 includes computerized models of at least one oscillator and at least one transform device that simulate oscillator 38 (shown in FIG. 1) and transform device 40 (shown in FIG. 1). Processor 62 receives input complex signal 48 from A/D converter 36 and processes signal 48. Processor 62 processes signal 48 by adjusting a plurality of operating parameters and executing a plurality of algorithms such that the oscillation frequency may synchronize with the frequency of the frequency of interest component of signal 48. Processor 62 retrieves the operating parameters from memory 64 via a memory signal 68. The operator operates input device 66 to provide the operating parameters to processor 62 via an input signal 70. Optionally, the operator may adjust the processor operating parameters to bias the natural oscillation frequency to be substantially similar to the frequency in the frequency of interest component of input complex signal 48. Processor 62 generates output complex signal 50. Furthermore, processor 62 converts output complex signal 50 from the time domain to the frequency domain, and then outputs frequency domain signal 52 by executing a plurality of algorithms.

Figure 10:
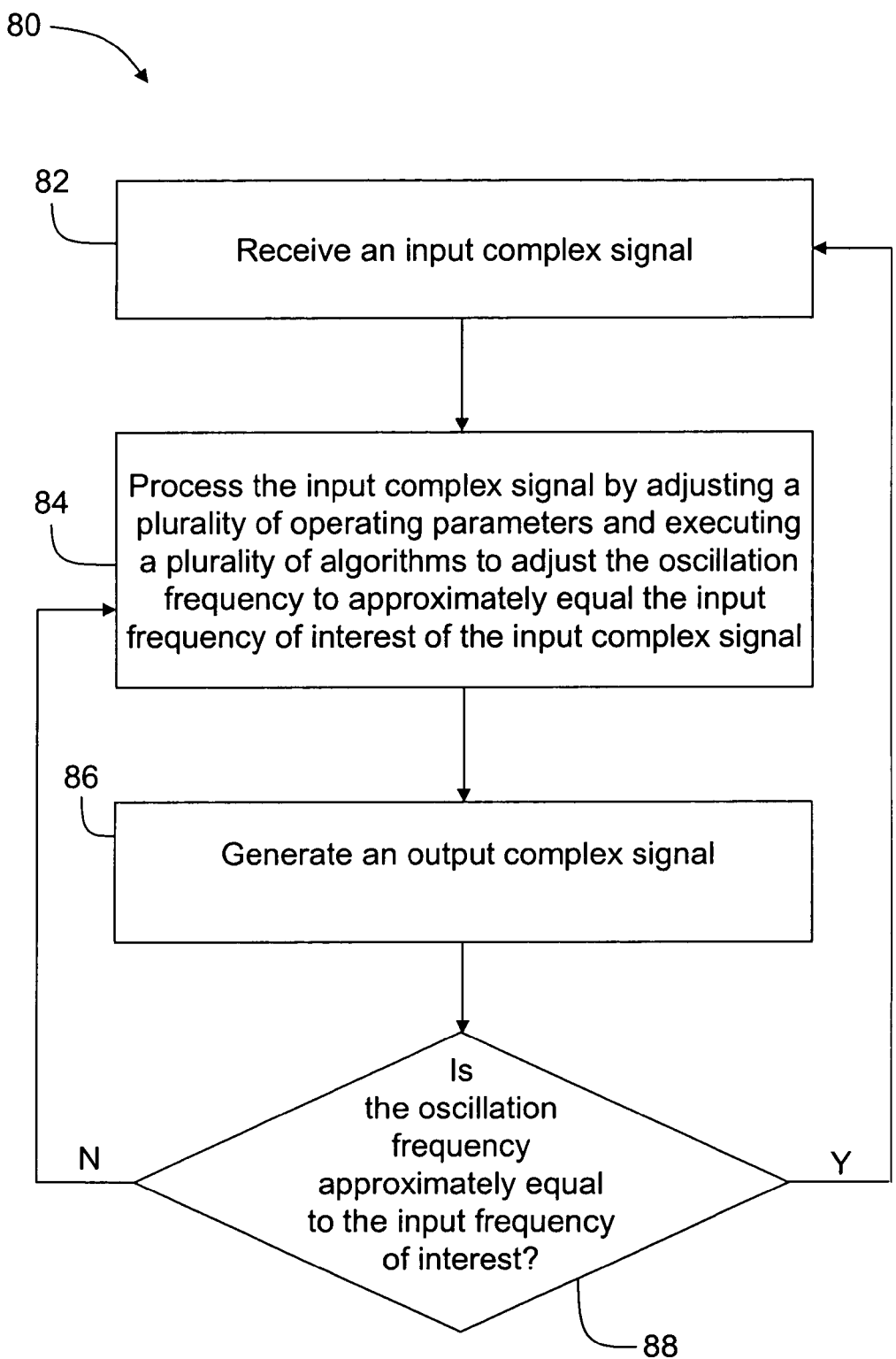
FIG. 10 is a flowchart of an exemplary method for modulating an oscillation frequency of the exemplary oscillator that may be used with the system in FIG. 1.

FIG. 10 is a flowchart of an exemplary method 80 for modulating an oscillation frequency of oscillator 38 (shown in FIG. 1) that may be used with system 30 (shown in FIG. 1). Method 80 includes a receiving input complex signal step 82. Method 80 further includes processing an input complex signal step 84. Processing is performed by adjusting a plurality of operating parameters and executing a plurality of algorithms within processor 60 (shown in FIG. 9) to subsequently adjust the oscillation frequency of the computerized model of oscillator 38 to approximately equal the frequency of interest of input complex signal 48 (shown in FIG. 1). Method 80 further includes a generating the output complex signal step 86. A determination step 88 includes generating a determination of whether the oscillation frequency approximately equals an input frequency of interest of input complex signal 48. When determination step 88 indicates that the oscillation frequency is not approximately equal to the frequency of interest the plurality of operating parameters of processor 60 are then adjusted and a plurality of algorithms are executed to shift the oscillation frequency of the computer model of oscillator 38 towards the frequency of interest of input complex signal 48. Method 80 is repeated when another input complex signal 48 is received.

Figure 11:
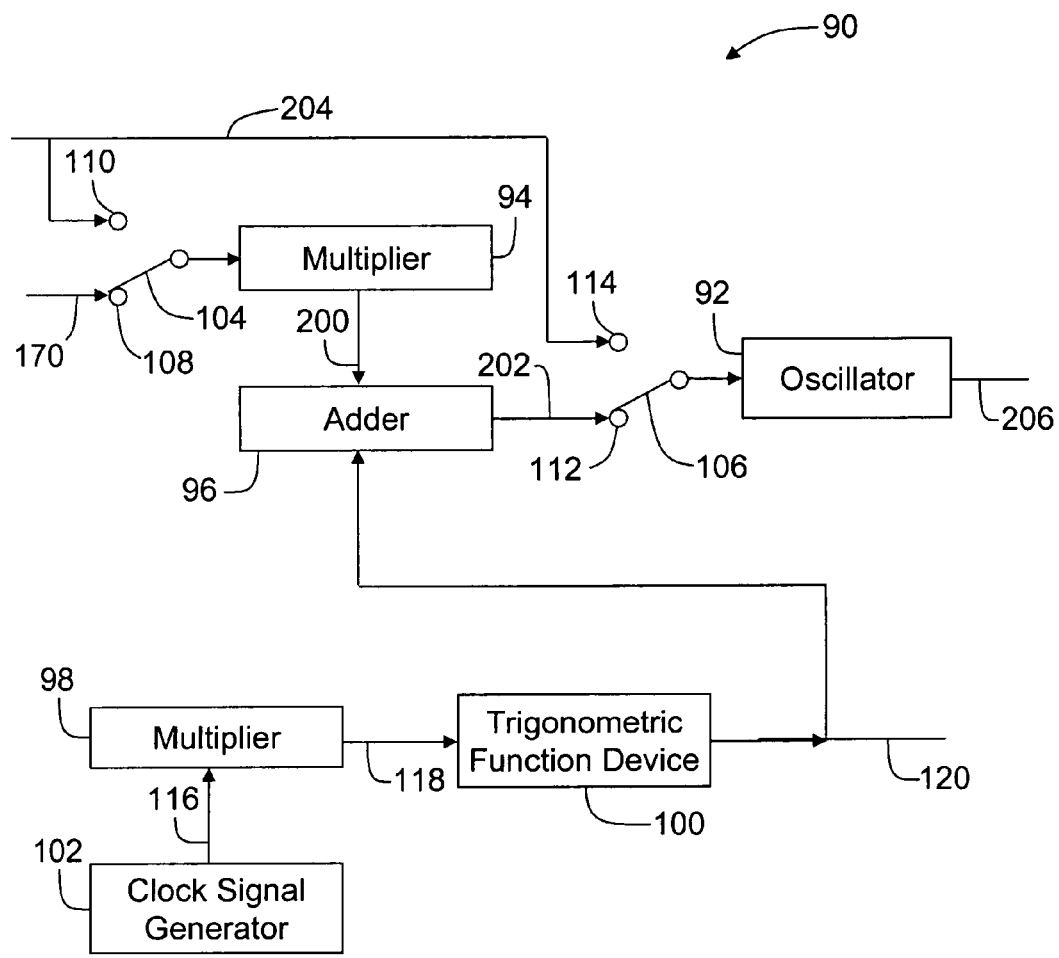
FIG. 11 is a block diagram of an alternative exemplary embodiment of a system that may be used to distinguish a signal of interest from a complex signal that may be used with the system in FIG. 1.

FIG. 11 is a block diagram of an alternative exemplary embodiment of a system 90 that may be used to distinguish a signal of interest from a complex signal that may be used with system 30 (shown in FIG. 1). System 90 includes an oscillator 92, which is an exemplary embodiment of oscillator 38 (shown in FIG. 1). System 90 further includes a first multiplier 94, an adder 96, a second multiplier 98, a trigonometric function device 100, a clock signal generator 102, a plurality of switches 104 and 106, and a plurality of terminals 108, 110, 112, and 114. Clock signal generator 102 may include a quartz crystal. Trigonometric function device 100 executes a trigonometric function, such as a sine function or a cosine function. Each of multipliers 94 and 98 may include an amplifier.

Clock signal generator 102 oscillates to generate a clock signal 116 that includes a pre-determined frequency, for example, 1 radian per second (rad/sec). Multiplier 98 receives clock frequency signal 116, multiplies frequency signal 116 with a non-dimensional constant, for example, 0.95, and outputs a multiplied clock frequency signal 118, for example, 0.95 rad/sec. Trigonometric function device 100 receives multiplied clock frequency signal 118 and executes a trigonometric algorithm on signal 118 to generate an input clock signal of interest 120. An example of signal 120 is sin ((0.95 rad/sec)*t) wherein '*' represents a multiplication function and t is time in seconds. Alternatively, signal 120 may be cos((0.95 rad/sec)*t). Signal 120 may be used to synchronize oscillator 92 to a frequency of interest as described above.

Figure 12:
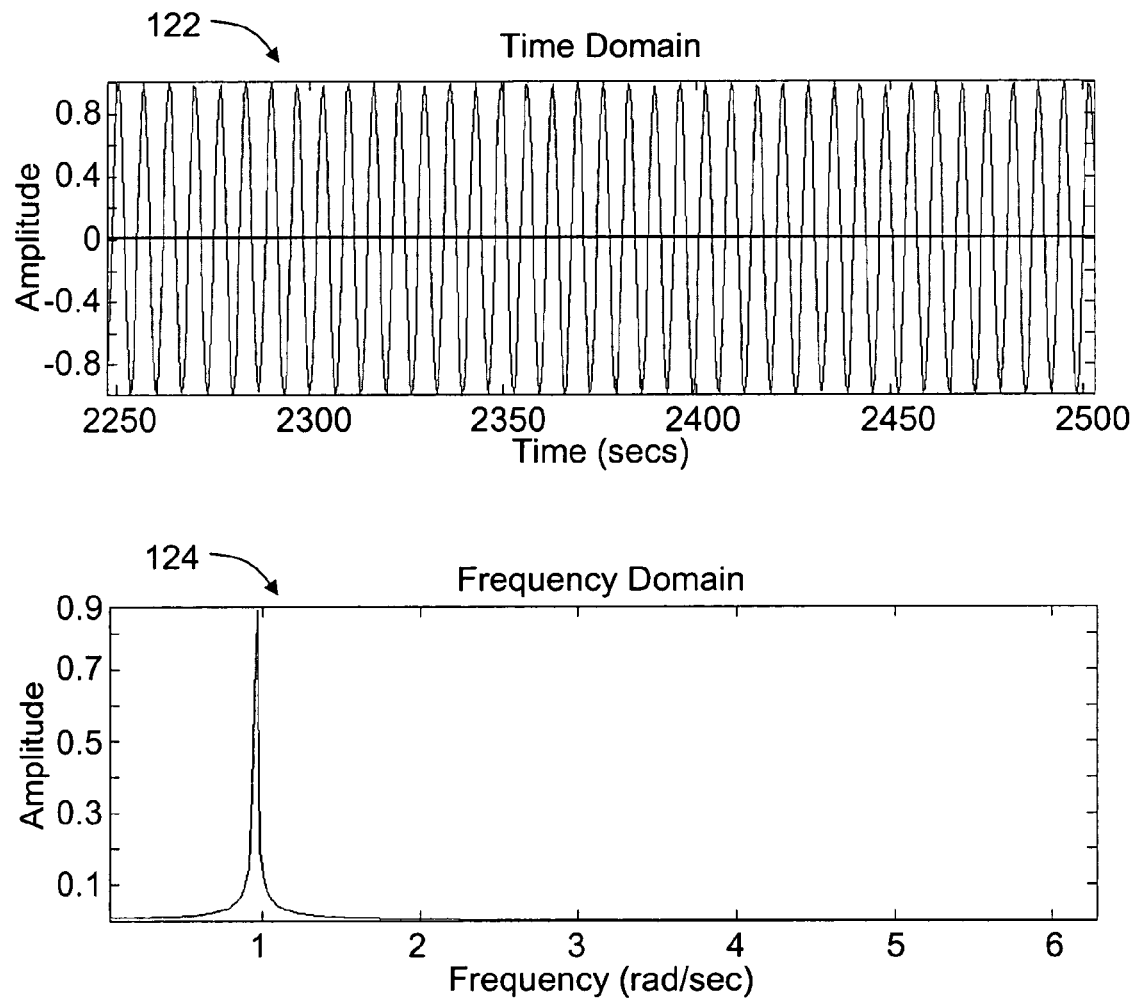
FIG. 12 is a graphical representation of an exemplary input clock signal of interest that may be used with the system in FIG. 11.

FIG. 12 is a graphical representation of an exemplary input clock signal of interest 120 that may be used with system 90 (shown in FIG. 11). Graph 122 illustrates an example of an exemplary input clock signal of interest 120 in the time domain. The amplitude is illustrated on the ordinate and time, in seconds, is illustrated on the abscissa. Graph 122 illustrates signal 120 as a substantially stable, repeating, sinusoidal curve with an amplitude of approximately 1 and a frequency of approximately 0.95 rad/sec. Graph 124 illustrates an example of an exemplary input clock signal of interest 120 in the frequency domain. The amplitude is illustrated on the ordinate and frequency, in rad/sec, is illustrated on the abscissa. Graph 124 illustrates signal 120 as having an amplitude of approximately 1 with a frequency peak at approximately 0.95 rad/sec.

Multiplier 94 receives a noise signal 170. Noise signal 170 represents noise from which input clock signal of interest 120 is indistinguishable. Multiplier 94 multiplies noise signal 170 with a factor to generate a multiplied noise signal 200. An example of the factor includes a constant, such as one, two, or three. The purpose of amplifying noise signal 170 is to intentionally combine a significant noise component with a signal containing a frequency of interest to evaluate the effectiveness of oscillator 92 in distinguishing the frequency of interest from the noise.

Figure 13:
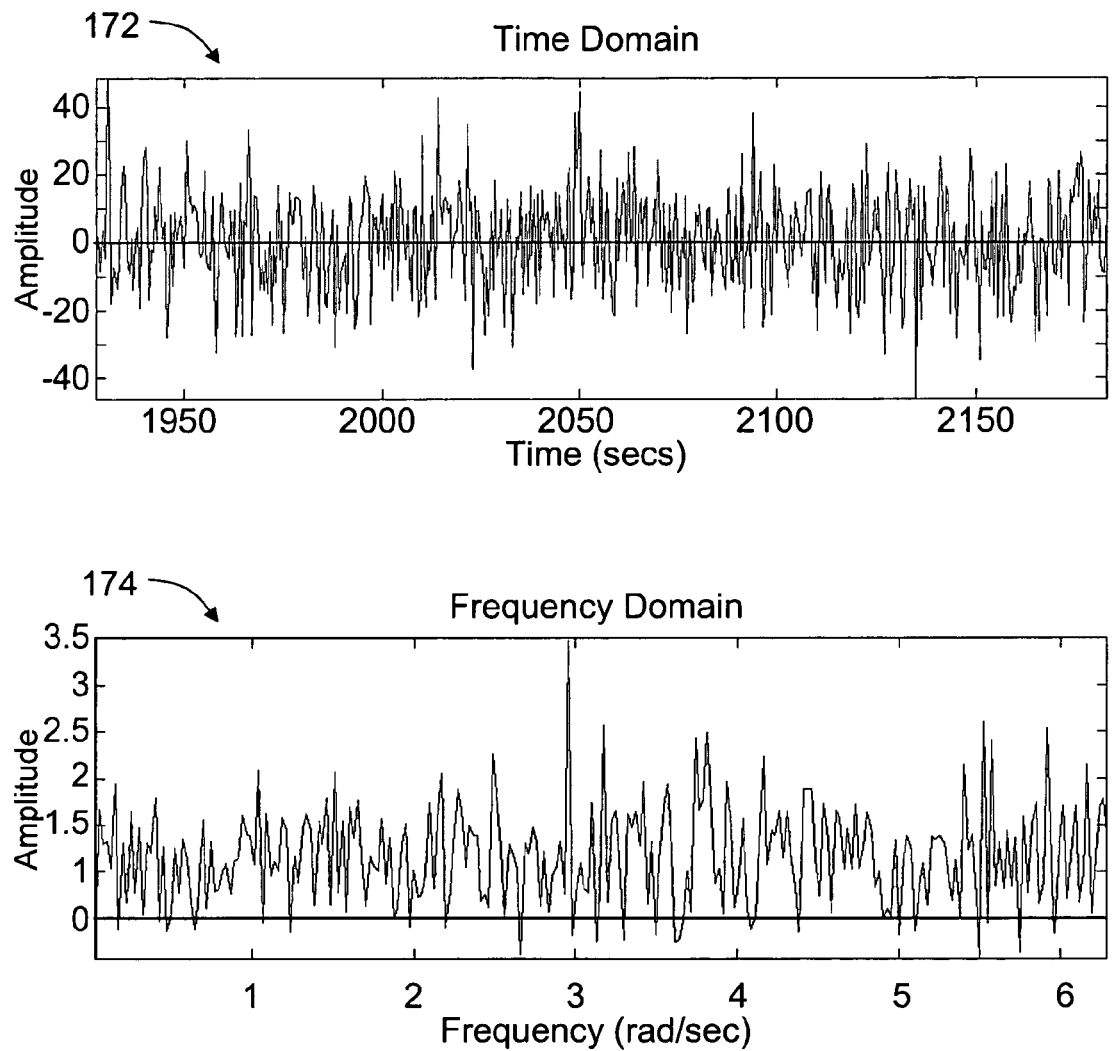
FIG. 13 is a graphical representation of an exemplary noise signal that may be used with the system in FIG. 11.

FIG. 13 is a graphical representation of an exemplary noise signal 170 that may be used with system 90 (shown in FIG. 11). Graph 172 illustrates an example of an exemplary noise signal 170 in the time domain. The amplitude is illustrated on the ordinate and time, in seconds, is illustrated on the abscissa. Graph 172 illustrates signal 170 as an unstable, random curve with varying amplitudes and frequencies. Graph 174 illustrates an example of an exemplary noise signal 170 in the frequency domain. The amplitude is illustrated on the ordinate and frequency, in rad/sec, is illustrated on the abscissa. Graph 174 illustrates signal 170 as a spectrum of frequencies with varying amplitudes and frequencies. It is noted that the amplitudes of noise signal 170 illustrated in graph 174 may represent a static perspective at a particular point in time and that the plurality of noise component amplitudes may be dynamic in system 90. It is also noted that the amplitudes of the frequency spectrum at approximately 0.95 rad/sec are greater than 1 which is the amplitude of signal 120. This condition, coupled with multiplier 94, as discussed above, may facilitate "burying" a subsequent frequency of interest under multiplied noise signal 200.

Adder 96 adds multiplied noise signal 200 with input clock signal of interest 120 to generate an input complex signal 202 containing an amplified noise component and a frequency of interest component.

When switch 106 is connected to terminal 114, oscillator 92 receives an input signal 204 that is pre-determined to equal 0, i.e., no signal is present. Also, oscillator 92 does not receive input complex signal 202. Oscillator 92 oscillates at a natural frequency determined by an operator selecting a plurality of pre-determined parameters as described above. Output signal 206 includes this natural frequency. The position of switch 104 is not relevant in this case.

Figure 14:
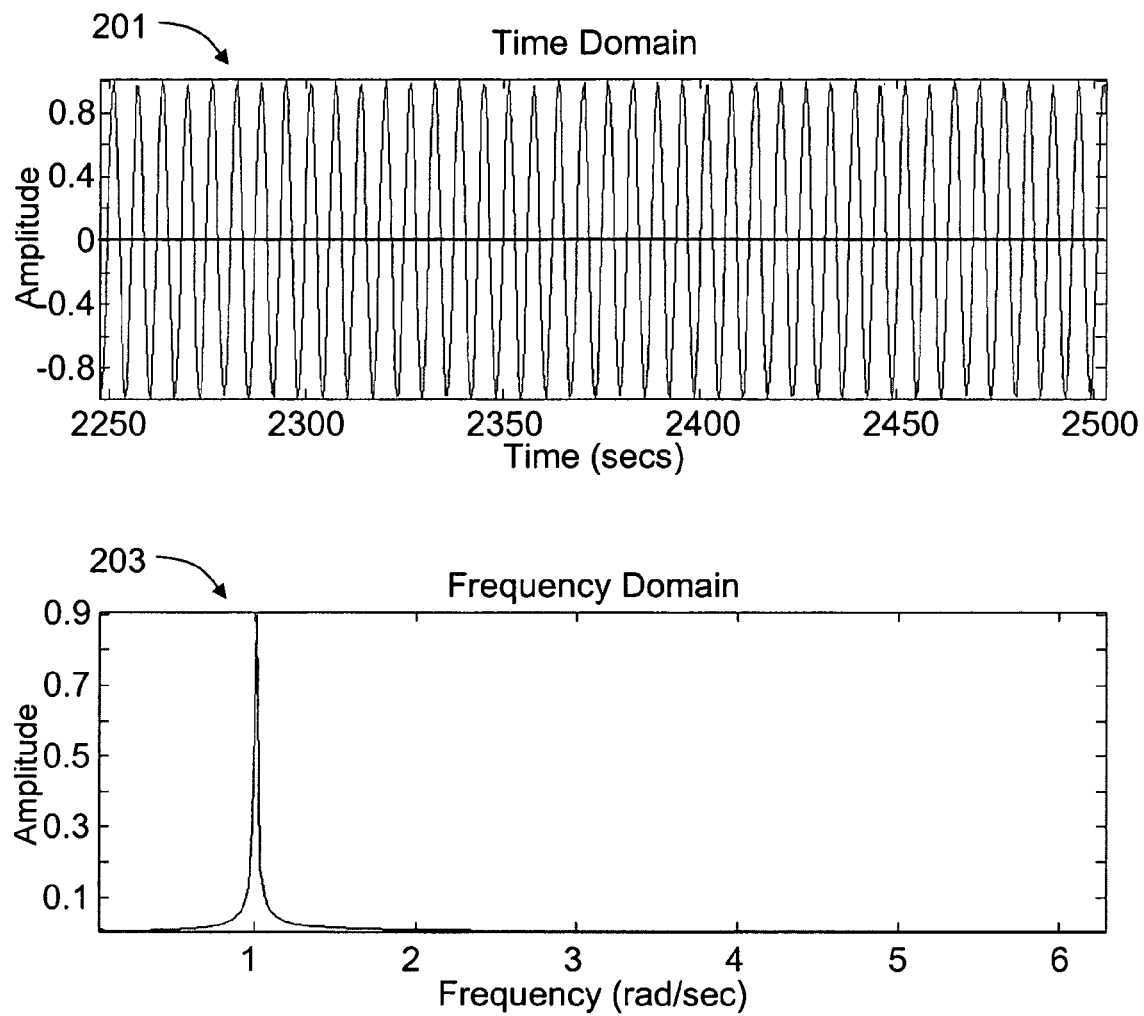
FIG. 14 is a graphical representation of an exemplary oscillator natural frequency output signal that may be used with the system in FIG. 11.

FIG. 14 is a graphical representation of an exemplary oscillator natural frequency output signal 206 that may be used with system 90 (shown in FIG. 11). Graph 201 illustrates an example of oscillator natural frequency output signal 206 in the time domain. The amplitude is illustrated on the ordinate and time, in seconds is illustrated on the abscissa. Graph 201 illustrates signal 206 as a substantially stable, repeating, sinusoidal curve with an amplitude of approximately 1 and a frequency of approximately 1 rad/sec. Graph 203 illustrates an example of oscillator natural frequency output signal 206 in the frequency domain. The amplitude is illustrated on the ordinate and frequency, in rad/sec, is illustrated on the abscissa. Graph 203 illustrates signal 206 as having an amplitude of approximately 1 with a frequency peak at approximately 1 rad/sec.

When switch 104 is connected to terminal 110, multiplier 94 receives input signal 204 that equals 0 and outputs multiplied noise signal 200, also equaling 0. When multiplied noise signal 200 is received, adder 96 adds signal 200 and input clock signal of interest 120 to generate input complex signal 202. In this case, input complex signal 202 is the same as input clock signal of interest 120 when multiplied noise signal 200 equals 0. Oscillator 92 receives input complex signal 202 when switch 106 is connected to terminal 112. When input complex signal 202 is received, oscillator 92 synchronizes its oscillation frequency with the frequency of signal 202, as described above, which in this case, is substantially equal to input clock signal of interest 120, and generates output complex signal 206 that has a frequency substantially similar to the frequency of interest.

Figure 15:
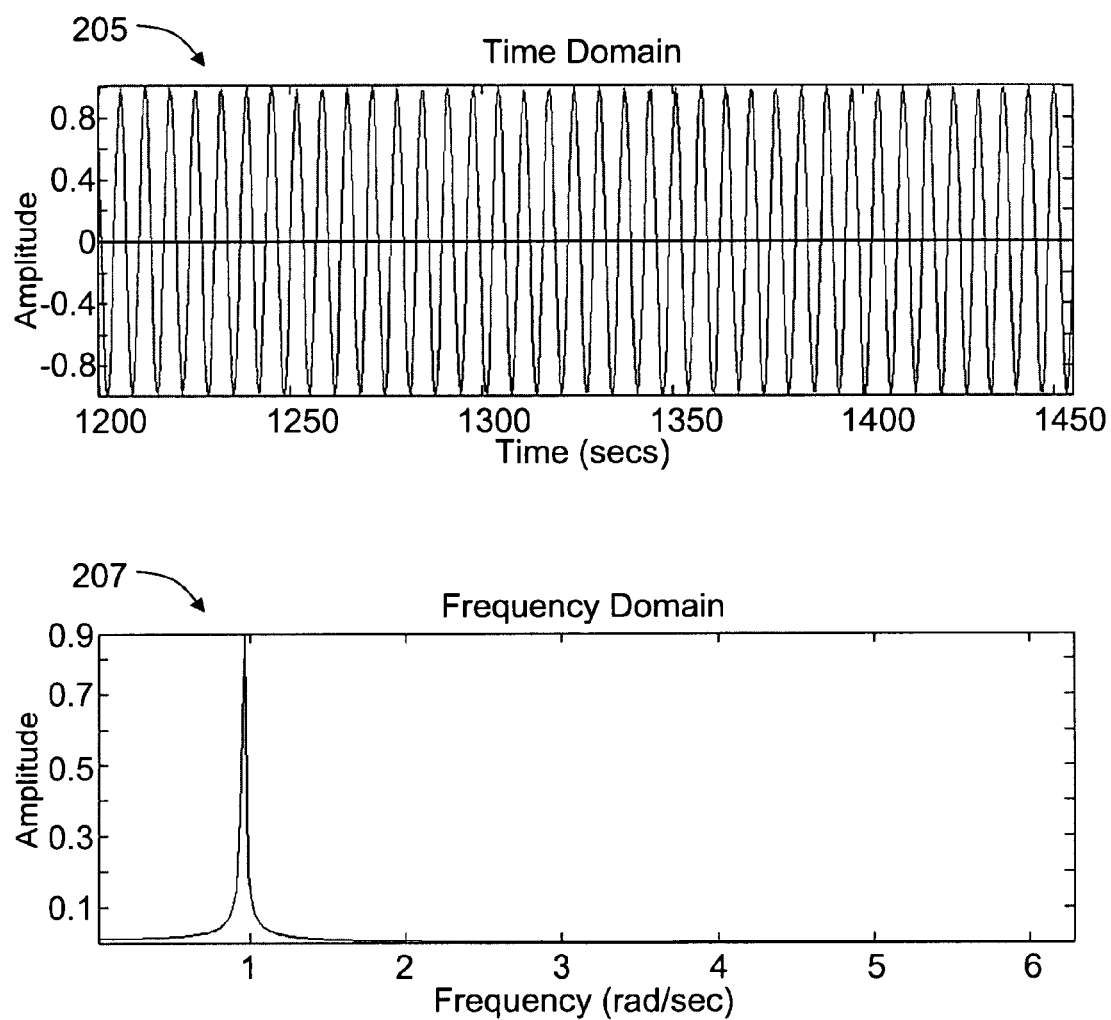
FIG. 15 is a graphical representation of an exemplary oscillator frequency of interest output signal that may be used with the system in FIG. 11.

FIG. 15 is a graphical representation of an exemplary oscillator output complex signal 206 that may be used with system 90 (shown in FIG. 11) when input signal 202 includes an input clock signal 120 component only. Graph 205 illustrates an example of oscillator output complex signal 206 in the time domain. The amplitude is illustrated on the ordinate and time, in seconds, is illustrated on the abscissa. Graph 205 illustrates signal 206 as a substantially stable, repeating, sinusoidal curve with an amplitude of approximately 1 and a frequency of approximately 0.95 rad/sec. Graph 207 illustrates an example of oscillator output complex signal 206 in the frequency domain. The amplitude is illustrated on the ordinate and frequency, in rad/sec, is illustrated on the abscissa. Graph 207 illustrates signal 206 as having an amplitude of approximately 1 with a frequency peak at approximately 0.95 rad/sec.

When switch 104 is connected to terminal 108, multiplier 94 receives oscillation noise signal 170 and multiplies signal 170 with a factor as discussed above to generate multiplied oscillation noise signal 200 such that the amplitude of noise signal 200 at and near the frequency of interest is larger in the noise component of signal 202 than in any other component of signal 202, i.e., the frequency of interest is "buried". Adder 96 adds multiplied oscillation noise signal 200 to input clock signal of interest 120 and outputs input complex oscillation signal 202. Oscillator 92 receives input complex oscillation signal 202 when switch 106 is connected to terminal 112. When input complex oscillation signal 202 is received, oscillator 92 synchronizes its oscillation frequency with the frequency of signal 202, which in this case, is substantially equal to input clock signal of interest 120, and generates output complex oscillation signal 206 that has a frequency substantially similar to the frequency of interest. Signal 206 further includes a frequency of interest component that is distinguished from the noise component. Furthermore, signal 206 represents signal 202 that has undergone a frequency rectification.

Figure 16:
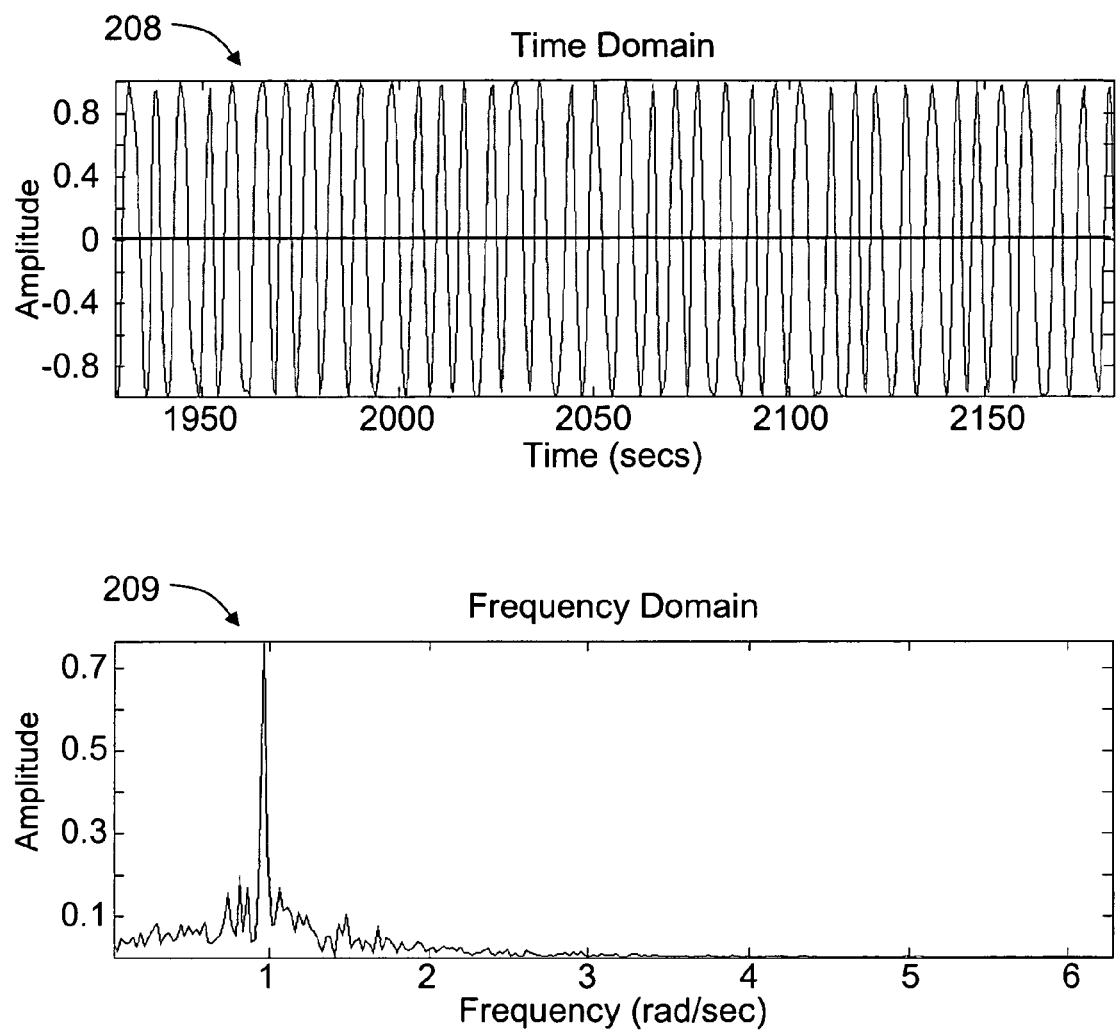
FIG. 16 is a graphical representation of an exemplary oscillator frequency rectified output signal that may be used with the system in FIG. 11.

FIG. 16 is a graphical representation of an exemplary oscillator output signal 206 that may be used with system 90 (shown in FIG. 11) that represents output complex signal 206 subsequent to frequency rectification. Graph 208 illustrates an example of an exemplary oscillator frequency rectified output complex signal 206 in the time domain. The amplitude is illustrated on the ordinate and time, in seconds, is illustrated on the abscissa. Graph 208 illustrates signal 206 as a substantially stable, repeating, sinusoidal curve with an amplitude substantially close to 1 and a frequency substantially close to 0.95 rad/sec. Graph 209 illustrates an example of an exemplary frequency rectified oscillator output complex signal 206 in the frequency domain. The amplitude is illustrated on the ordinate and frequency, in rad/sec, is illustrated on the abscissa. Graph 209 illustrates signal 206 as having an amplitude of slightly less than 1, i.e., approximately 0.8, with a frequency peak substantially close to 0.95 rad/sec with smaller peaks to either side of 0.95 rad/sec.

Figure 17:
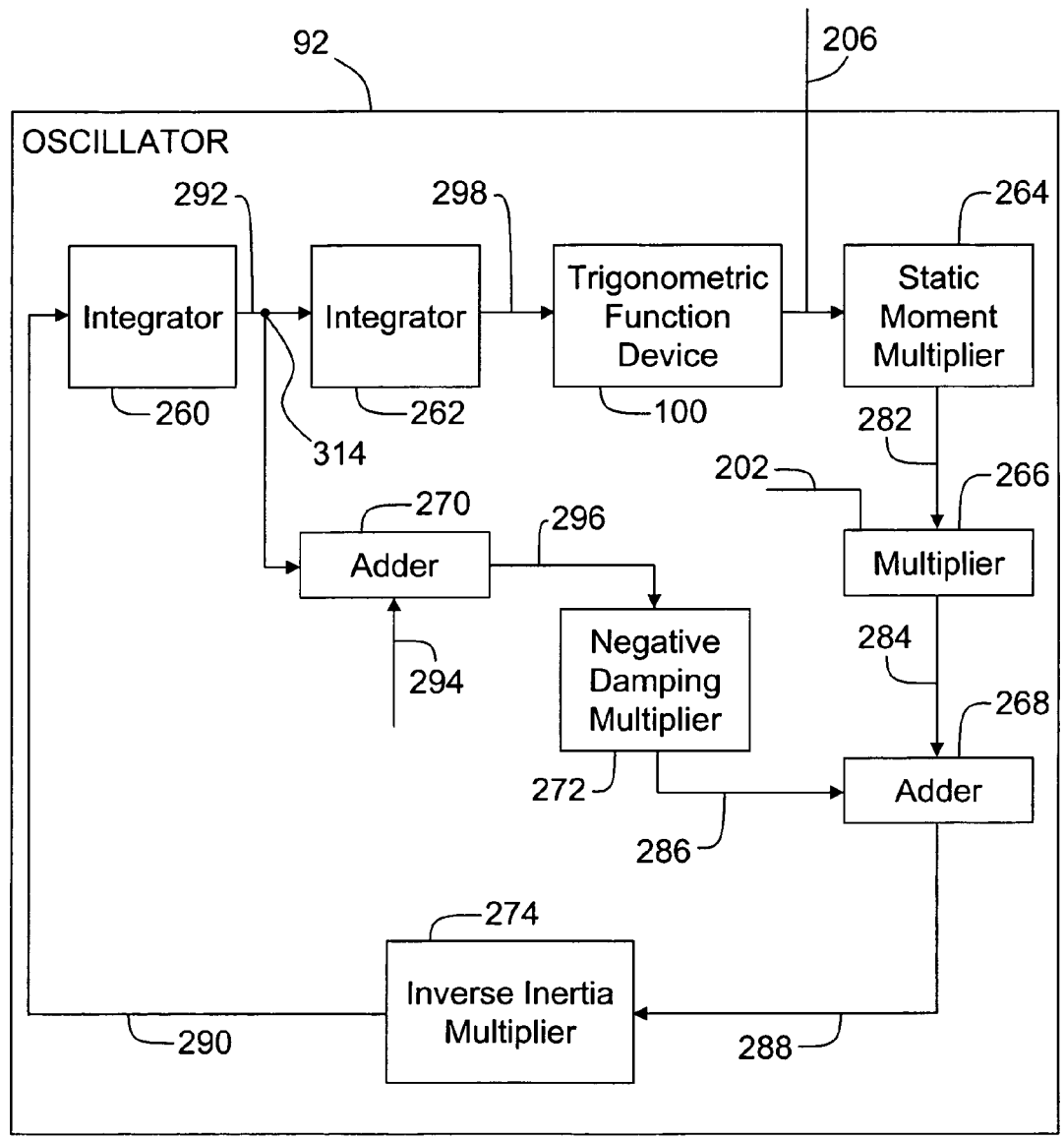
FIG. 17 is a block diagram of an exemplary embodiment of a general oscillator that may be used with the system shown in the FIG. 11.

FIG. 17 is a block diagram of an exemplary embodiment of oscillator 92 that may be used with system 90 (shown in FIG. 11). Oscillator 92 includes a plurality of integrators 260 and 262, trigonometric function device 100, a static moment multiplier 264, a multiplier 266, a plurality of adders 268 and 270, a negative damping multiplier 272, and an inverse inertia multiplier 274. Each of static moment multiplier 264, negative damping multiplier 272, and inverse inertia multiplier 274 may include an amplifier.

When input complex signal 202 is received, multiplier 266 multiplies signal 202 by a static moment multiplier output signal 282 to output a multiplier output signal 284. Adder 268 receives multiplier output signal 284 and a negative damping multiplier output signal 286, and adds signal 284 and signal 286 to generate an adder output signal 288. When adder output signal 288 is received, inverse inertia multiplier 274 multiplies signal 288 with an inverse 1/I of inertia I of oscillator 92 to generate an inverse inertia multiplier output signal 290. Integrator 260 receives inverse inertia multiplier output signal 290, integrates signal 290 over time t to generate an integrator output signal 292. When integrator output signal 292 is received, adder 270 adds signal 292 to a negative value 294 of the oscillation frequency f of oscillator 92, and outputs an adder output signal 296. Negative damping multiplier 272 receives adder output signal 296, multiplies signal 296 by a negative value of a damping D of oscillator 92, and generates negative damping multiplier output signal 286. When integrator output signal 292 is received, integrator 262 integrates signal 292 over time t to generate an integrator output signal 298. Trigonometric function device 100 receives integrator output signal 298 and executes the trigonometric function on signal 298 to generate output complex signal 206. When output complex signal 206 is received, static moment multiplier 264 multiplies signal 206 with a static moment w of oscillator 92 to output static moment multiplier output signal 282.

It is noted that a terminal 314 includes a switch that connects integrator output signal 292 to integrator 262 at one time t and connects integrator output signal 292 to adder 270 at another time t.

In the exemplary embodiment, oscillator 92 is represented by:

$$I*d^2u/dt^2 + D*(du/dt - f) = w*\sin(u)*\text{input complex signal 202}, \quad (5)$$

wherein '*' represents multiplication, sin(u) is output complex oscillation signal 206, d/dt represents a derivative with respect to time t, and u is an angular variable output, such as an oscillation, of oscillator 92. Adjustable parameters of oscillator 92 include I, D, f, and w as defined above. The purpose of adjusting these parameters is to bias oscillator 92 to oscillate substantially at a specific frequency of interest. These parameters may be adjusted via computer 60 (shown in FIG. 9).

An example of a set of parameters to bias oscillator 92 to a particular frequency of interest is: I=1, D=1, f=1, and, w=0.5. When the input frequency of interest is desired to be 0.95 rad/sec, input clock signal of interest 120 may be adjusted to approximately 0.95 rad/sec, and f may be selected to be approximately 1 rad/sec. It is noted that 1 rad/sec is approximately equal to 0.95 rad/sec and is within one order of magnitude as discussed above. For another example, when frequency of interest is desired again to be 0.95 rad/sec, input clock signal of interest 120 may be adjusted to approximately 0.95 rad/sec, f may be selected at any increment between 0.90 rad/sec and 1 rad/sec. It is again noted that 0.9 and 1 rad/sec are approximately equal to 0.95 rad/sec and are within one order of magnitude.

Therefore, when input complex signal 202 is received by oscillator 92, and the frequency of signal 202 is approximately equal to the frequency of interest, oscillator 92 synchronizes to input 202 as described above.

When the input to oscillator 92 is input signal 204 with a value of 0 as described above, equation (5) becomes:

$$I*d^2u/dt^2+D*(du/dt-f)=0, \quad (6)$$

wherein oscillator 92 may oscillate at a natural frequency as described above.

Figure 18:
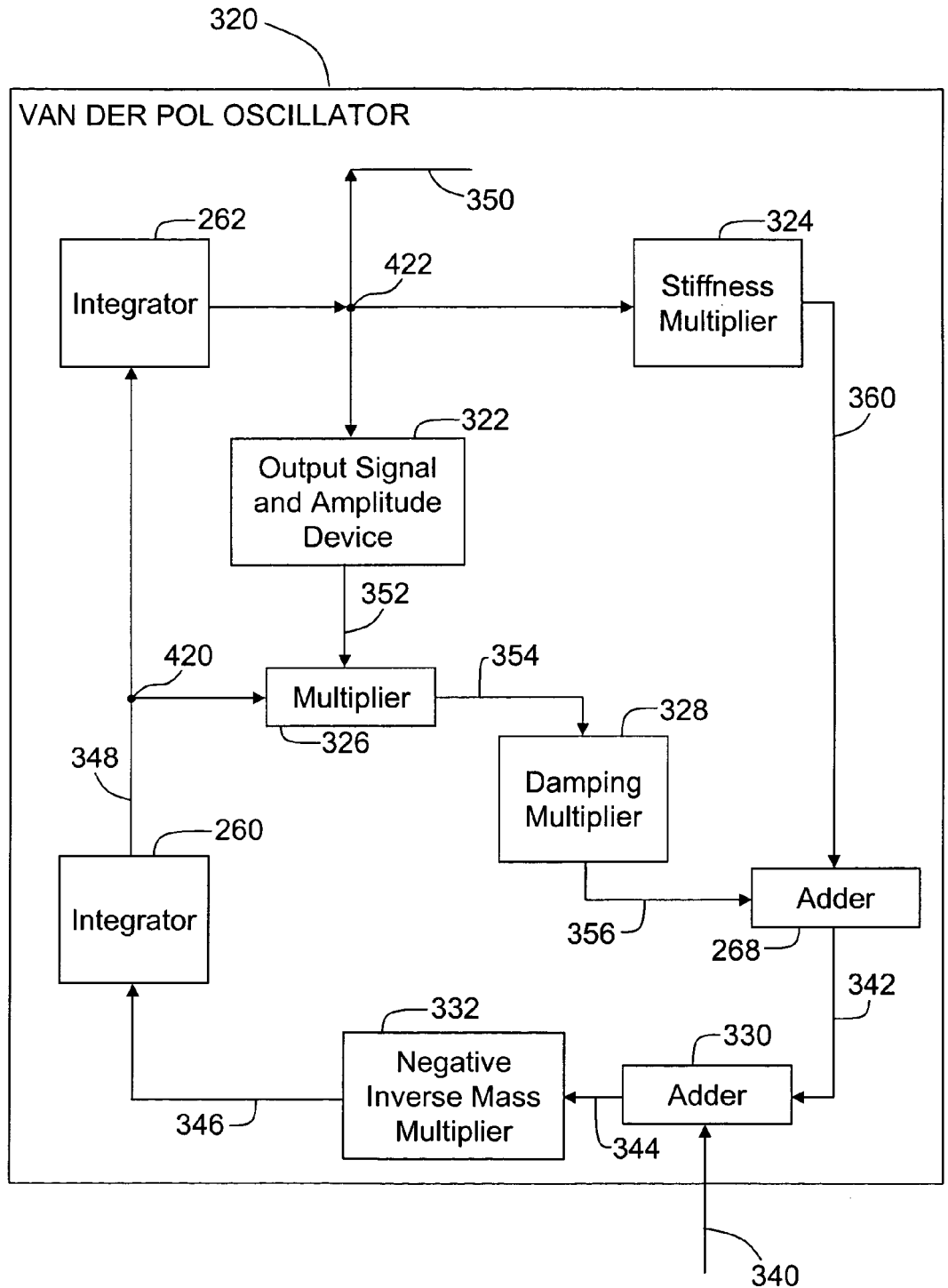
FIG. 18 is a block diagram of an exemplary embodiment of a Van der Pol oscillator that may be used with the system shown in the FIG. 11.

FIG. 18 is a block diagram of an exemplary embodiment of a Van der Pol oscillator 320 that may be used with system 90 (shown in FIG. 11). Van der Pol oscillator 320 includes integrators 260 and 262, an output signal and amplitude device 322, a stiffness multiplier 324, a multiplier 326, a damping multiplier 328, adder 268, an adder 330, and a negative inverse mass multiplier 332. Each of stiffness multiplier 324, negative inverse mass multiplier 332, and damping multiplier 328 may represent an amplifier.

When an input Van der Pol complex signal 340 and an adder output signal 342 are received, adder 330 adds signal 340 and signal 342 to generate an adder output signal 344. Negative inverse multiplier 332 receives adder output signal 344 and multiplies signal 344 with a negative value of an inverse (1/M) of a mass M of Van der Pol oscillator 340 to output a negative inverse mass multiplier signal 346. When negative inverse mass multiplier signal 346 is received, integrator 260 integrates signal 346 over time t to output an integrator output signal 348. Integrator 262 receives integrator output signal 348 and integrates signal 348 over time t to output an output Van der Pol complex signal 350. When output Van der Pol complex signal 350 is received, output signal and amplitude device 322 multiplies signal 350 by signal 350 raised to a power x to generate a first result, multiplies a parameter A of signal 350 with parameter A raised to the power x to generate a second result, and subtracts the second result from the first result to output an output signal 352. It is noted that x is an integer.

Multiplier 326 receives output signal 352 and integrator output signal 348, and multiplies signal 352 with signal 348 to output a multiplier output signal 354. When multiplier output signal 354 is received, damping multiplier 328 multiplies signal 354 with a damping $D_v$ of Van der Pol oscillator 320 to generate a damping multiplier output signal 356. Stiffness multiplier 324 receives output Van der Pol complex signal 350 and multiplies signal 350 by a stiffness K of Van der Pol oscillator 320 to generate a stiffness multiplier output signal 360. When damping multiplier output signal 356 and stiffness multiplier output signal 360 are received, adder 268 adds signal 356 and signal 360 to generate adder output signal 342.

In the exemplary embodiment, Van der Pol oscillator 320 is represented by:

$$M*d^2v/dt^2-D_v*(0.25*A^2-v^2)*dv/dt+K*v=\text{input Van der Pol oscillator complex signal 340}, \quad (7)$$

wherein v is output Van der Pol complex signal 350, '*' represents multiplication, and d/dt represents a derivative with respect to time t. Adjustable parameters of oscillator 320 include M, $D_v$, A, and K as defined above. When input Van der Pol oscillator complex signal 340 is 0, equation (3) becomes:

$$M*d^2v/dt^2-D_v*(0.25*A^2-v^2)*dv/dt+K*v=0. \quad (8)$$

It is noted that a terminal 420 includes a switch that connects integrator output signal 348 to multiplier 326 at one time t and connects integrator output signal 348 to integrator 262 at another time t. It is further noted that a terminal 422 includes a switch that connects output Van der Pol complex signal 350 to stiffness multiplier 324 at one time t and connects signal 350 to output signal and amplitude device 322 at another time t.

Integrators 260 and 262 perform the integration calculations of the associated differential equations using numerical integration techniques that may include using a fourth-order Runga-Kutta method with variable integration steps. The method includes the use of a computing device, for example, computer 60 (shown in FIG. 9) to integrate the associated differential equations by numerically integrating the values for four intervals for each of a plurality of variable time steps, the number of time steps being selected by an operator, and summing the results. It is noted that this method also includes determining a value for each of the time intervals of each time step through interpolating that includes solving a set of eleven equations with thirteen unknowns where values for two unknowns are chosen arbitrarily. Executing the associated numerical integration algorithms may use a significant amount of computing resources, for example, memory 64 (shown in FIG. 9) and processor 62 (shown in FIG. 9) processing capacities, for an extended period of time, i.e., approximately 136 seconds per sample.

Figure 19:
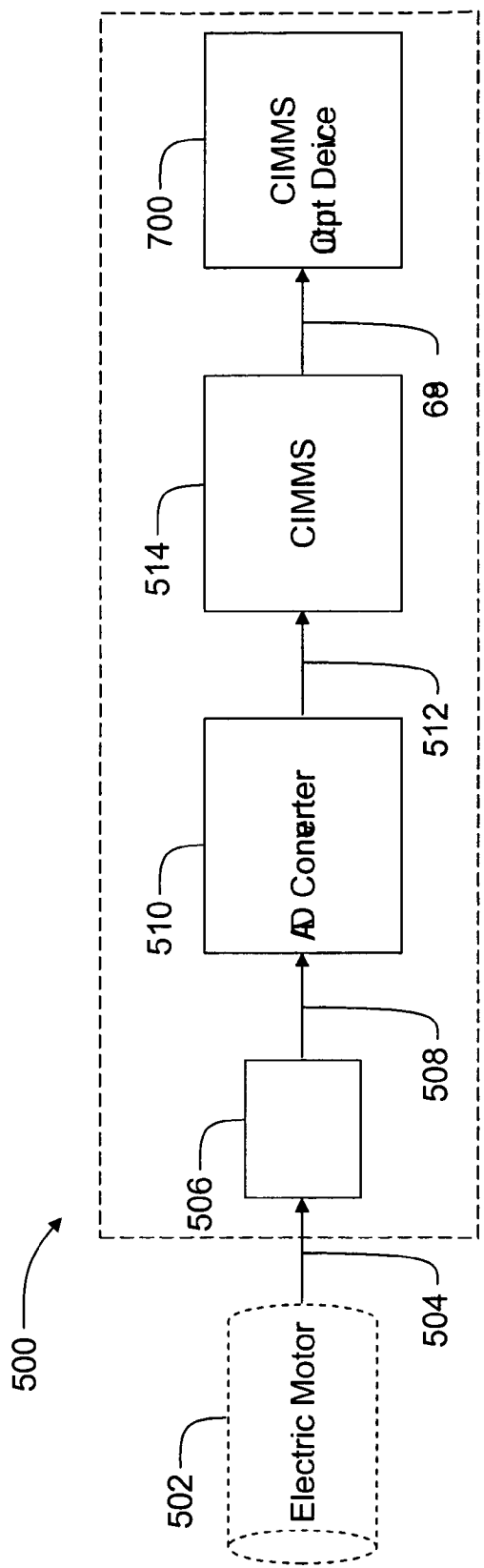
FIG. 19 is a block diagram of an exemplary embodiment of a system for distinguishing a signal of interest from a complex signal received from an electric motor.

FIG. 19 is an exemplary embodiment of a system 500 for recovering a signal of interest from a complex signal received from an electric motor 502. System 500 includes an electric current transducer 506, an analog-to-digital (A/D) converter 510, a continuous integrated machinery monitoring system (CIMMS) 514 and a CIMMS output device 700. Transducer 506 may be coupled to motor 502. Motor 502 may represent, but is not limited to, being one of three electric current conductors of a three-phase electric motor. Electric current transducer 506 may represent, but is not limited to, a current transformer that senses current flow to motor 502 including changes to current flow. Alternatively, a clamp-on current sensor may be used to measure current flow. Such signal changes are generated by a change in electric motor 502 operating conditions, such as a variation in the loading of electric motor 502.

A continuous integrated machinery monitoring system (CIMMS) 514 may be embodied in a combination of a plurality of hardware components and software programs. CIMMS 514 receives and analyzes a plurality of data to determine the existing operating conditions of a plurality of machines and/or a plurality of processes employing the machines. CIMMS 514 uses direct measurements from various sensors available on each machine and derived quantities from all, or a portion of all, of the sensors. CIMMS 514, using predetermined analysis rules, determines a failure or impending failure of a machine. CIMMS 514 further provides for performing trend analysis on machine combinations and displaying data and/or trends in a variety of formats so as to afford a user of CIMMS 514 an ability to quickly interpret health assessment and trend information provided by CIMMS 514.

In the exemplary embodiment, motor 502 draws an electric current 504 that is stepped down to a smaller current signal by electric current transducer 506. Electric current transducer 506 senses electric current 504 and converts electric current 504 into an analog output signal 508 that has a form suitable for reception by A/D converter 510. A/D converter 510 receives analog output signal 508 and converts signal 508 from an analog form to a digital form. A/D converter 510 outputs a digital input complex signal 512 that includes a plurality of digitized signal 508 samples generated with a pre-determined rate, in a pre-determined time period, wherein the time period may be referred to as a sampling time step. Signal 512 also includes a component that contains a frequency of interest and a noise component. The frequency of interest may be indistinguishable from the noise component. An example of the frequency of interest is a natural frequency of the alternating electric current flow into electric motor 502. The natural frequency may be displayed on a label on electric motor 502.

CIMMS 514 receives input complex signal 512 from A/D converter 510, processes input complex signal 512, and outputs a CIMMS output signal 698 to CIMMS output device 700 for displaying data and/or trends and/or pre-determined operator notifications.

Figure 20:
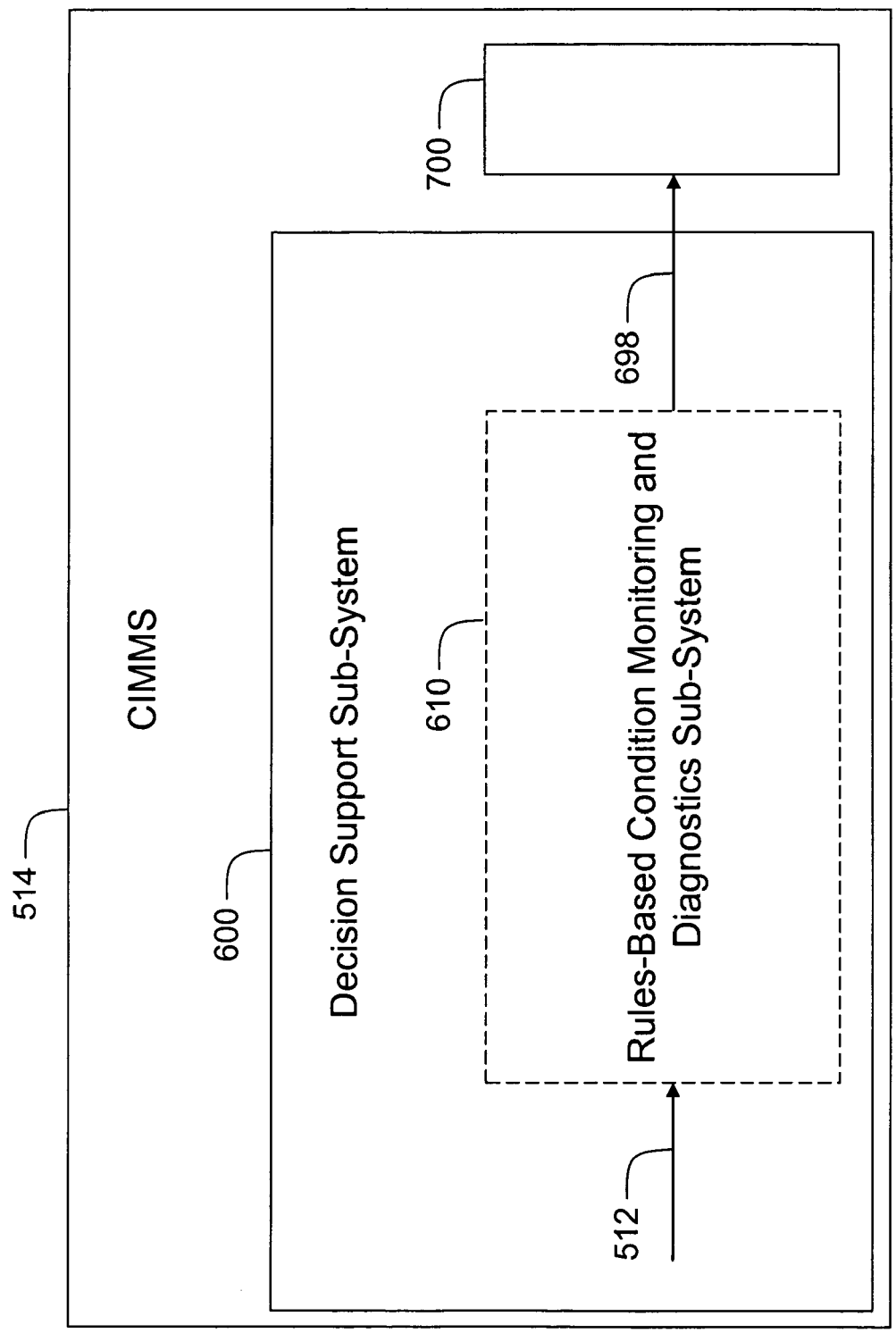
FIG. 20 is a block diagram of an exemplary embodiment of a CIMMS which may contain a decision support sub-system that may be used with the system shown in FIG. 19.

FIG. 20 is a block diagram of an exemplary embodiment of a CIMMS 514 which may contain a decision support subsystem 600 that may be used with system 500 (shown in FIG. 19). Decision support system 600 contains a rules-based condition monitoring and diagnostics sub-system 610 and outputs to a CIMMS output device 700.

Rules-based condition monitoring and diagnostics sub-system 610 receives input complex signal 512 and processes the signal to distinguish a frequency of interest component from a noise component in complex signal 512, perform a set of diagnostic evaluations on the frequency of interest, and output CIMMS output signal 698 to CIMMS output device 700 for displaying data and/or trends and/or pre-determined operator notifications.

Figure 21:
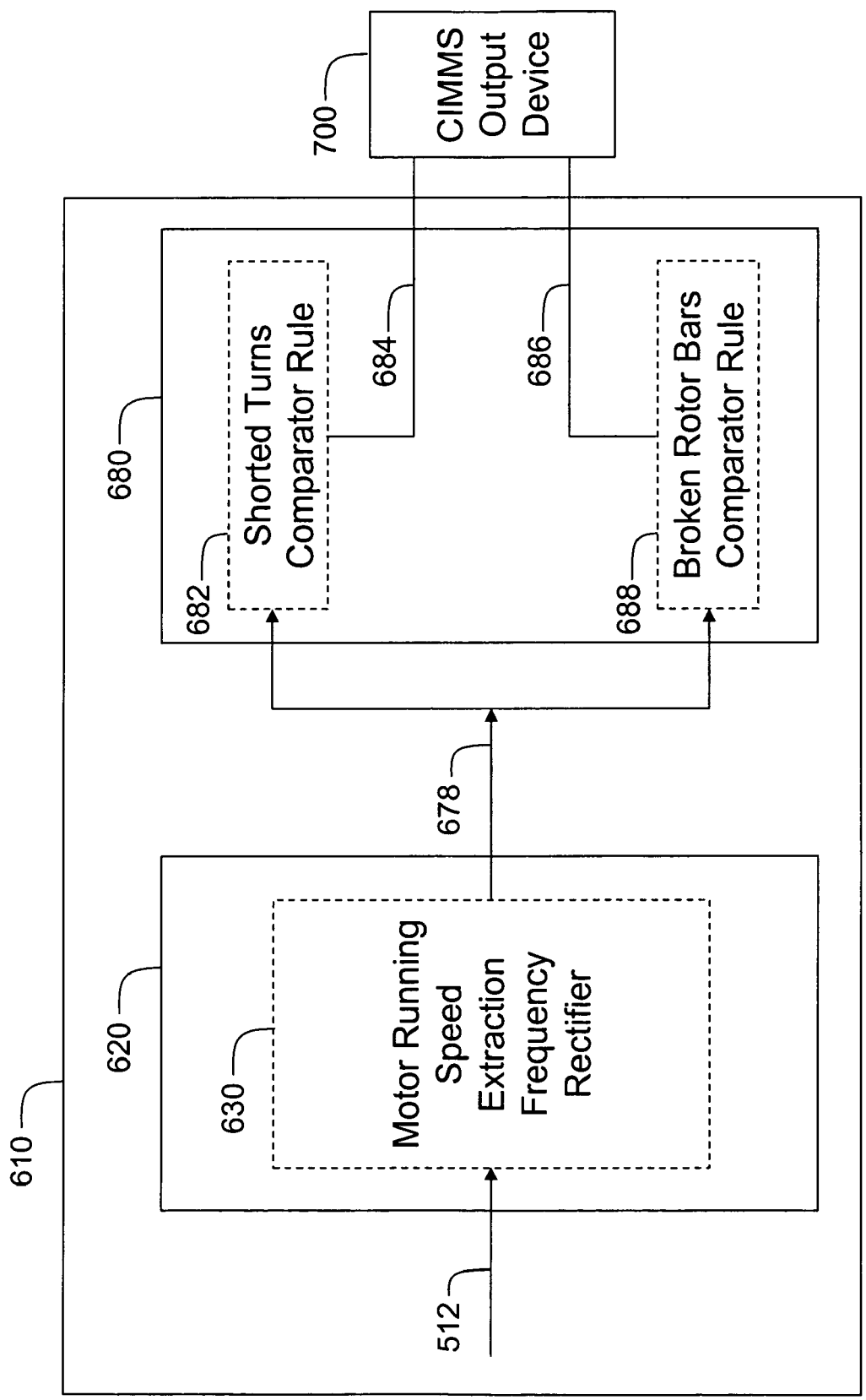
FIG. 21 is a block diagram of an exemplary embodiment of a rules-based condition monitoring and diagnostics sub-system that may reside in the decision support sub-system shown in FIG. 20.

FIG. 21 is an exemplary embodiment of rules-based condition monitoring and diagnostics sub-system 610 that may reside in decision support sub-system 514 (shown in FIG. 20). The rules-based condition monitoring and diagnostics sub-system 610 includes a plurality of frequency rectifiers 620. The plurality of frequency rectifiers 620 includes a motor running speed frequency rectifier and extraction device 630. Rules-based condition monitoring and diagnostics sub-system 610 further includes an electric motor conditioning monitoring and diagnostics rules set 680 that further includes, but is not limited to, a shorted turns comparator rule 682 and a broken rotor bars comparator rule 688. Outputs from the comparator rules are outputted to CIMMS output device 700.

Input complex signal 512 is received by motor running speed frequency rectifier and extraction device 630 and processes the signal to distinguish a frequency of interest component from a noise component in complex signal 512. Motor running speed frequency rectifier and extraction device 630 outputs a motor running speed signal 678 to electric motor conditioning monitoring and diagnostics rules set 680. Motor running speed signal 678 is inputted to shorted turns comparator rule 682 and broken rotor bars comparator rule 688. Comparator rules 682 and 688 perform a set of diagnostic evaluations on motor running speed signal 678 and output a shorted turns comparator rule output signal 684 and a broken rotor bars comparator rule output signal 686 to CIMMS output device 700.

Figure 22:
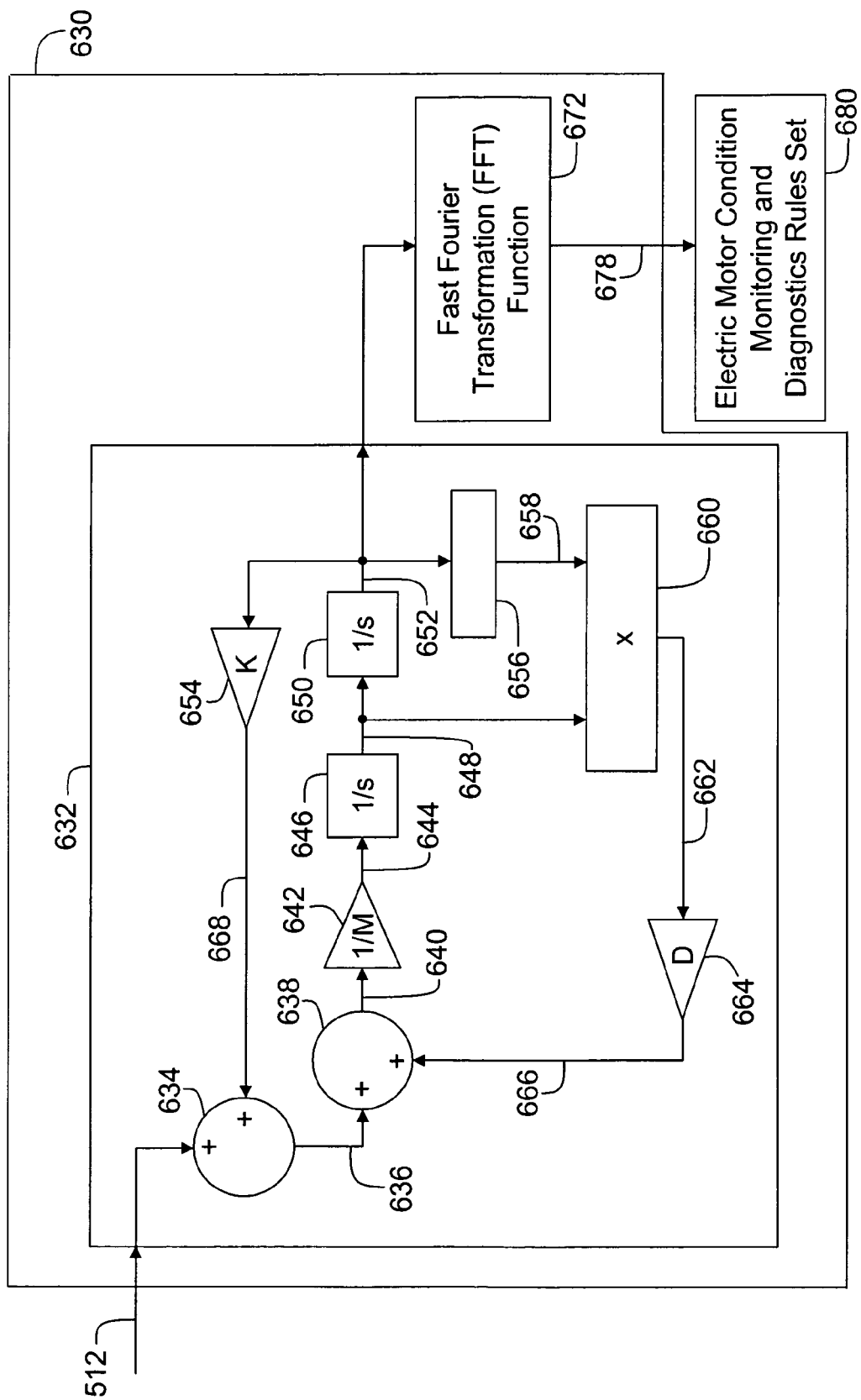
FIG. 22 is a block diagram of an exemplary embodiment of a motor running speed frequency rectifier and extraction device that may reside in the rules-based condition monitoring and diagnostics sub-system shown in FIG. 21.

FIG. 22 is a block diagram of an exemplary embodiment of a motor running speed frequency rectifier and extraction device 630 that may reside in rules-based condition monitoring and diagnostics sub-system 610 (shown in FIG. 21). Motor running speed frequency rectifier and extraction device 630 includes a Van der Pol oscillator 632 that executes motor running speed frequency rectification and a Fast Fourier Transform (FFT) function device 672 that executes motor running speed frequency extraction.

An exemplary embodiment of an exemplary oscillator known as a Van der Pol oscillator 632 is included in FIG. 22. Van der Pol oscillator 632 includes integrators 646 and 650, an output signal and amplitude device 656, a linear stiffness multiplier 654, a multiplier 660, a non-linear damping multiplier 664, a first adder 634, a second adder 638, and a negative inverse mass multiplier 642. Each of linear stiffness multiplier 654, negative inverse mass multiplier 642, and non-linear damping multiplier 664 may represent an amplifier. Multiplier 660 may include a modulator.

First adder 634 adds an input complex signal 512 to a linear stiffness multiplier output signal 668 and outputs a first adder output signal 636 that is subsequently input to second adder 638. Second adder 636 adds first adder output signal 636 to a non-linear dampening multiplier output signal 666 and outputs the sum as a second adder output signal 640 to negative inverse mass multiplier 642.

Negative inverse mass multiplier 642 receives second adder output signal 640 and multiplies signal 640 with a negative value of an inverse (1/M) of a mass parameter M of Van der Pol oscillator 632 to output a negative inverse mass multiplier output signal 644. When negative inverse mass multiplier output signal 644 is received, first integrator 646 integrates signal 644 over time t to output a first integrator output signal 648. Second integrator 650 receives first integrator output signal 648 and integrates signal 648 over time t to output a Van der Pol oscillator complex output signal 652. When Van der Pol oscillator complex output signal 652 is received, output signal and amplitude device 656 multiplies signal 652 by signal 652 raised to a power x to generate a first result, multiplies a parameter A of signal 652 with parameter A raised to the power x and multiplies the product by 0.25 to generate a second result, and subtracts the second result from the first result to output an output signal and amplitude device output signal 658. It is noted that x is an integer.

Multiplier 660 receives output signal 658 and second integrator output signal 648, and multiplies signal 658 with signal 648 to output a multiplier output signal 662. When multiplier output signal 662 is received, non-linear damping multiplier 664 multiplies signal 662 with a damping parameter $D_v$ of Van der Pol oscillator 632 to generate a non-liner damping multiplier output signal 666.

Linear stiffness multiplier 654 receives Van der Pol oscillator complex output signal 652 and multiplies signal 652 by a stiffness parameter K of Van der Pol oscillator 632 to generate a linear stiffness multiplier output signal 668.

It is noted that an alternative embodiment may include a switch that connects first integrator output signal 648 to multiplier 660 at one time t and connects first integrator output signal 648 to second integrator 650 at another time t. The alternative embodiment may further include a switch that connects the Van der Pol oscillator complex output signal 652 to the linear stiffness multiplier 654 at one time t and connects signal 652 to the output signal and amplitude device 656 at another time t.

In the exemplary embodiment, Van der Pol oscillator 632 is represented by:

$$M*d^2v/dt^2 - D_v*(0.25*A^2 - v^2)*dv/dt + K*v = \text{input Van der Pol oscillator complex signal 512,} \quad (7)$$

wherein v is Van der Pol complex output signal 652, '*' represents multiplication, and d/dt represents a derivative with respect to time t. Adjustable parameters of oscillator 632 include M, $D_v$, A, and K as defined above. When input Van der Pol oscillator complex signal 512 is 0, equation (3) becomes:

$$M*d^2v/dt^2 - D_v*(0.25*A^2 - v^2)*dv/dt + K*v = 0, \quad (8)$$

wherein Van der Pol oscillator 320 may oscillate at a natural frequency as described above.

In the exemplary embodiment, first integrator 646 and second integrator 650 perform accelerated integration calculations of the associated differential equations using numerical integration via the fourth-order Runge-Kutta method with fixed integration steps. The method includes the use of a computing device described above to integrate the associated differential equations by numerically integrating the values for four intervals for a single, fixed time step. In the exemplary embodiment, the single, fixed time step may be substantially similar to A/D converter 510 sampling time step as defined above. As compared to using variable integration steps as described above, executing the associated numerical integration algorithms with a single, fixed time step, reduces the number of interpolations executed. Reducing the number of interpolations may reduce the amount of computing resources dedicated to executing the associated algorithms, for example, memory 54 (shown in FIG. 6) and processor 50 (shown in FIG. 6) processing capacities. Subsequently, the processing time may be reduced from approximately 136 seconds per sample to approximately 0.5 seconds per sample.

FFT function device 672 receives Van der Pol oscillator complex output signal 652 and applies a Fourier transform function to signal 652 and transforms signal 652 from a time domain to a frequency domain to extract the frequency of interest. FFT function device 672 outputs motor running speed signal 678 in the frequency domain to electric motor condition monitoring and diagnostics rules set 680.

The frequency rectification methods and systems described herein facilitate distinguishing frequencies of interest. More specifically, the accelerated integrators in the oscillator may accelerate the processing of machine monitoring data. As a result, there may be a reduction of burden on computational resources and a reduction of the delivery time latency of information to operators for more timely decision-making.

Although the methods and systems described and/or illustrated herein are described and/or illustrated with respect to a rotating machine, and more specifically an electric motor, practice of the methods and systems described and/or illustrated herein is not limited to electric motors nor to rotating machines generally. Rather, the methods and systems described and/or illustrated herein are applicable to monitoring any parameter of any component on any machine.

Exemplary embodiments of condition monitoring methods are described above in detail. The methods are not limited to the specific embodiments described herein nor to the specific components being monitored, but rather, the monitoring method may be utilized independently and separately from other methods described herein or to monitor other components not described herein. For example, other motor components can also be monitored using the methods described herein.

While the invention has been described in terms of various specific embodiments, those skilled in the art may recognize that the invention can be practiced with modification within the spirit and scope of the claims.

What is claimed is:

1. A method of monitoring the condition of a machine, said method comprising:
    receiving an input complex signal from the machine wherein the input complex signal comprises a plurality of signal components, the plurality of signal components comprising at least one signal component containing a pre-determined frequency of interest and at least one signal component containing noise;
    processing the input complex signal and generating an output complex signal comprising a plurality of signal components, the plurality of signal components comprising at least one signal component containing a pre-determined frequency of interest and at least one signal component containing noise, wherein said processing the input complex signal comprises executing a fixed time step integration algorithm using a fourth-order Runge-Kutta model of integration with a single, fixed integration time step that is defined to be substantially equal to a sampling time step of the input complex signal; and
    processing the output complex signal to assess whether a fault exists, wherein the pre-determined frequency of interest is extracted from the output complex signal; and wherein the pre-determined frequency of interest is displayed on a display.

2. A method in accordance with claim 1 wherein receiving an input complex signal comprises sampling the input complex signal at a predetermined sampling rate, the sampling rate comprising the sampling time step.

3. A method in accordance with claim 1 wherein receiving an input complex signal further comprises receiving a sinusoidal analog signal and converting the sinusoidal analog signal to a digital input complex signal.

4. A method in accordance with claim 1 wherein processing the input complex signal comprises using at least one oscillator to facilitate improving a signal-to-noise ratio of the output complex signal.

5. A method in accordance with claim 4 wherein using at least one oscillator to facilitate improving the signal-to-noise ratio of the output complex signal comprises configuring the oscillator to oscillate with a frequency substantially similar to the frequency of interest.

6. A method in accordance with claim 4 wherein using an oscillator to facilitate improving the signal-to-noise ratio of the output complex signal further comprises using a plurality of integrating algorithms.

7. A method in accordance with claim 1 wherein processing the output complex signal comprises:
    transforming an oscillator output signal from a time domain to a frequency domain; and
    comparing an amplitude of the frequency of interest contained in the output complex signal to pre-determined values.

8. A method in accordance with claim 7 wherein transforming an oscillator output signal comprises performing a Fast Fourier Transform on the output complex signal.

9. A monitoring system comprising:
    an analog-to-digital converter for converting an analog, sinusoidal signal received from a machine to a digital input complex signal, wherein the input complex signal comprises a plurality of signal components, the plurality of signal components comprising at least one signal component containing a pre-determined frequency of interest and at least one signal component containing noise;

a frequency rectifier with a plurality of accelerated integration algorithms for processing the input complex signal and generating an output complex signal, wherein said plurality of accelerated integration algorithms comprise a fixed time step algorithm for integration, said fixed time step algorithm comprising a fourth-order Runge-Kutta model of integration with a single, fixed integration time step that is substantially equal to a sampling time step of the input complex signal, wherein the output complex signal comprises a plurality of signal components, the plurality of signal components comprising at least one signal component containing the pre-determined frequency of interest and at least one signal component containing noise;

at least one frequency extraction device comprising at least one time domain-to-frequency domain converter, and wherein said at least one frequency extraction device extracts the pre-determined frequency of interest from the output complex signal; and a monitoring and diagnostic sub-system for processing the output complex signal from said frequency rectifier to assess whether a fault exists, wherein said monitoring and diagnostic sub-system comprises a display for displaying the pre-determined frequency of interest.

10. A monitoring system in accordance with claim 9 wherein said frequency rectifier comprises at least one oscillator.

11. A monitoring system in accordance with claim 10 wherein said oscillator comprises said plurality of accelerated integration algorithms.

12. A monitoring system in accordance with claim 9 wherein said at least one frequency extraction device further comprises a Fast Fourier Transform.

13. A monitoring system in accordance with claim 9 wherein said monitoring and diagnostic sub-system comprises a rules-based decision support sub-system, said rules-based decision support sub-system comprising at least one comparator, said comparator comprising at least one pre-determined value, said pre-determined value configured for comparison with an amplitude of the frequency of interest contained in the output complex signal.

14. A frequency rectification system comprising:

an analog-to-digital converter for converting an analog, sinusoidal signal received from a machine to a digital input complex signal, wherein the input complex signal comprises a plurality of signal components, the plurality of signal components comprising at least one signal component containing a pre-determined frequency of interest and at least one signal component containing noise; and a frequency rectifier with a plurality of accelerated integration algorithms for processing the input complex signal and generating an output complex signal, wherein said plurality of accelerated integration algorithms comprise a fixed time step algorithm for integration, said fixed time step algorithm comprising a fourth-order Runge-Kutta model of integration with a single, fixed integration time step that is substantially equal to a sampling time step of the input complex signal, wherein the output complex signal comprises a plurality of signal components, the plurality of signal components comprising at least one signal component containing the pre-determined frequency of interest and at least one signal component containing noise, wherein the output complex signal is transmitted to a frequency extraction device that extracts the pre-determined frequency of interest and that transmits the pre-determined frequency of interest to a display.

15. A frequency rectification system in accordance with claim 14 wherein said frequency rectifier comprises an oscillator, said oscillator comprising said plurality of accelerated integration algorithms.

* * * * *